United States Patent [19]
Asai et al.

[11] Patent Number: 5,588,195
[45] Date of Patent: Dec. 31, 1996

[54] ELECTRONIC-COMPONENT MOUNTING APPARATUS

[75] Inventors: Koichi Asai, Nagoya; Koso Matsumoto, Aichi; Yasuo Muto, Chiryu, all of Japan

[73] Assignee: Fuji Machine Mfg. Co., Ltd., Aichi-ken, Japan

[21] Appl. No.: 527,984

[22] Filed: Sep. 14, 1995

[30] Foreign Application Priority Data

Sep. 26, 1994 [JP] Japan .................. 6-229496

[51] Int. Cl.⁶ ...................................... H05K 13/04
[52] U.S. Cl. ........................... 29/33 M; 29/740; 29/742
[58] Field of Search ................... 29/740, 759, 33 J, 29/33 M, 761, 757, 56, 564, 742; 361/807; 364/478

[56] References Cited

U.S. PATENT DOCUMENTS

| | | | |
|---|---|---|---|
| 5,060,366 | 10/1991 | Asai et al. | 29/759 X |
| 5,070,598 | 12/1991 | Itagaki et al. | 29/740 X |
| 5,128,834 | 7/1992 | Kaschke | 361/807 |
| 5,267,173 | 11/1993 | Tanizawa et al. | 364/478 |
| 5,331,731 | 7/1994 | Suzuki et al. | 29/759 |
| 5,500,606 | 3/1996 | Holmes | 324/761 |
| 5,500,997 | 3/1996 | Kobayashi et al. | 29/740 |

FOREIGN PATENT DOCUMENTS

| | | |
|---|---|---|
| 2-69999 | 3/1990 | Japan . |
| 4-345008 | 12/1992 | Japan . |
| 6-6993 | 1/1994 | Japan . |

OTHER PUBLICATIONS

Abstract of JP 4–345008.
Abstract of JP 6–6993.

*Primary Examiner*—William R. Briggs
*Attorney, Agent, or Firm*—Oliff & Berridge

[57] ABSTRACT

An electronic-component mounting apparatus including two or more actuators including two or more electric actuators which are provided on a movable member supported by a frame member and supporting an electronic-component mounting head are operable on electric energy, a power source which is provided on the frame member and provides the electric energy, a main control device which is provided on the frame member, an actuator control device which is provided on the movable member and controls the electric actuators, an electricity supplying device which includes a first supplying section provided on the frame member and a second supplying section provided on the movable member and which supplies the electric energy from the power source to the actuator control device, without having any wire connection between the first and second supplying sections, and an information transmitting device which includes a first transmitting section provided on the frame member and a second transmitting section provided on the movable member and which transmits, between the main control device and the actuator control device, information needed to control the electric actuators, without having any wire connection between the first and second transmitting sections.

11 Claims, 13 Drawing Sheets

ELECTRONIC-COMPONENT MOUNTING APPARATUS

BACKGROUND OF THE INVENTION

1. Field of the Invention

The present invention relates to an electronic-component (EC) mounting apparatus and particularly to the art of improving the durability of the EC mounting apparatus.

2. Related Art Statement

There is known an EC mounting apparatus which includes a movable EC mounting head for mounting an EC or ECs on an object such as a printed circuit board (PCB). The prior EC mounting apparatus includes (a) a frame member, (b) a movable member supported by the frame member such that the movable member is movable relative to the frame member, (c) a moving device which moves the movable member relative to the frame member, and (d) a mounting head which is provided on the movable member and mounts an electronic component (EC) on an object. The prior apparatus additionally includes a mounting-head moving device including an actuator for moving the mounting head relative to the movable member.

An example of the above EC mounting apparatus is disclosed in Japanese Patent Application laid open for inspection under Publication No. 2(1990)-69999. The disclosed EC mounting apparatus includes a rotary head which is supported by a frame member such that the head is rotatable about a vertical, axis line thereof. A plurality of EC mounting heads are provided along a circle whose center rides on the rotation axis line of the rotary head. Each of the EC mounting heads includes an EC suction nozzle for holding an EC by vacuum. The EC suction nozzle is supported by a support member of the EC mounting head such that the suction nozzle is directed downward and is rotatable about an axis line thereof. On the rotary head, there are provided a plurality of rotating devices for the plurality of EC mounting heads, respectively. Each rotating device has a drive source in the form of an electric motor and rotates the EC suction nozzle about the axis line thereof. Meanwhile, on the side of the frame member, there are provided an EC supplying section where ECs are supplied to the side of the rotary head, a EC-holding-error detecting section where error of EC holding of the suction nozzle is detected, and an EC mounting section where ECs are mounted on a PCB.

As the rotary head is rotated, each of the EC mounting heads is sequentially moved to the EC supplying section, EC-holding-error detecting section, and EC mounting section one after another in the order of description. Thus, an EC is held by an EC mounting head, error of holding of the EC is detected, and the EC is mounted on a PCB. At the EC-holding-error detecting station, positional errors, $\delta x$, $\delta y$, of the EC held by each EC suction nozzle are calculated in a horizontal X-Y coordinate or plane, and an angular error, $\delta \theta$, of the EC is calculated around the axis line of the suction nozzle. During a time duration when the EC mounting head is moved from the EC-holding-error detecting station to the EC mounting station, the EC suction nozzle is rotated to correct the angular error $\delta \theta$ of the EC held thereby.

In the case where the electric motors are provided on the rotatable rotary head as described above, it is required that electric energy be supplied from a power source provided on the frame member, to the electric motors on the rotary head, irrespective of the current rotational phase of the rotary head. The above-identified patent document fails to specify how to supply the electric energy from the side of the frame member to the side of the rotary head. Generally, however, slip rings are used. For example, a metal ring as a slip ring is attached to the rotary head and an electrically conductive brush fixed to the frame member is contacted with the metal ring, so that electric energy is supplied through the brush and ring. In this case, the same number of slip rings as that of the electric motors are employed, so that the electric energy is supplied to each of the electric motors.

Since, however, the slip rings are used such that the electric energy is supplied through the brush contacted with the metal rings that rotate together with the rotary head, the EC mounting apparatus suffer from low durability and low life expectancy.

The above problems also occur to a different EC mounting apparatus wherein a movable member is reciprocated along a straight or curved line. In the second apparatus, too, if the movable member is provided with an electric actuator that is operable on electric energy, it is also required that the electric energy be supplied from the side of a frame member to the side of the movable member, irrespective of the current relative-positional relationship between the two members.

SUMMARY OF THE INVENTION

It is therefore an object of the present invention to provide an electronic-component (EC) mounting apparatus which has, on a movable member, electric actuators relating to an EC mounting head and enjoys high durability.

The above object has been achieved by the present invention, which provides an electronic-component mounting apparatus, including a frame member, a movable member supported by the frame member such that the movable member is movable relative to the frame member, a moving device which moves the movable member relative to the frame member, a mounting head which is provided on the movable member and mounts an electronic component on an object such as a printed circuit board, and at least two devices out of (a) at least one rotating device including a first actuator which rotates the mounting head about an axis line thereof, (b) at least one advancing and retracting device including a second actuator which advances and retracts the mounting head in opposite directions parallel to an axis line thereof, respectively, (c) at least one vacuum-supply control device including a third actuator which controls vacuum supply to a suction nozzle of the mounting head, and (d) at least one suction-nozzle selecting device including a fourth actuator which selects one of a plurality of suction nozzles of the mounting head, the at least two devices including at least two actuators out of at least one first actuator, at least one second actuator, at least one third actuator, and at least one fourth actuator, wherein the improvement comprises: the at least two actuators including at least two electric actuators which are provided on the movable member and are operable on electric energy, a power source which is provided on the frame member and provides the electric energy, a main control device which is provided on the frame member, an actuator control device which is provided on the movable member and controls the electric actuators, an electricity supplying device which includes a first supplying section provided on the frame member and a second supplying section provided on the movable member and which supplies the electric energy from the power source to the actuator control device, without having any wire connection between the first and second supplying sections, and an information transmitting device which includes a first transmitting section provided on the frame member and a second transmitting section provided on the movable member and which transmits, between the main control device and the actuator control device, information needed to control the electric actuators, without having any wire connection between the first and second transmitting sections. The at least two electric actuators may comprise at least one electric drive source selected from the group consisting of an electric motor and a solenoid-operated valve. The at least two devices may comprise two devices of different sorts out of the rotating device, the advancing and retracting device, the vacuum-supply control device, and the suction-nozzle selecting device. Alternatively, the at least two devices may comprise two devices of a same sort out of a plurality of the rotating devices, a plurality of the advancing and retracting devices, a plurality of the vacuum-supply control devices, and a plurality of the suction-nozzle selecting devices.

In the EC mounting apparatus constructed as described above, the no-connection electricity supplying device supplies electric energy to each of two or more electric actuators provided on the movable member. Thus, each of the two or more electric actuators is supplied with the electric energy from a common power source via the no-connection electricity supplying device. However, the actuator control device controls the electric energy to be supplied to each actuator, based on the information supplied via the no-connection information transmitting device, and thereby operates each actuator. The actuator control device may comprise two or more separate controllers for the two or more actuators, respectively. Thus, in the present EC mounting apparatus, the no-connection electricity supplying device supplies electric energy to each of two or more electric actuators provided on the movable member and the no-connection information transmitting device supplies control information to each actuator. Therefore, unlike the case where electric energy is supplied via slip rings, the present EC mounting apparatus is free from the problem of low durability. Stated differently, the present apparatus enjoys improved life expectancy.

In a preferred embodiment in accordance with the present invention, the movable member comprises a rotary member which is supported by the frame member such that the rotary member is rotatable about an axis line thereof, and the moving device comprises a rotating device which rotates the rotary member about the axis line thereof relative to the frame member. In this embodiment, as the rotary member rotates, a rotational phase of the rotary member relative to the frame member changes. However, each actuator provided on the rotary member can appropriately be controlled and operated by the actuator control device on the rotary member, based on the electric energy supplied via the no-connection electricity supplying device and the information supplied via the no-connection information transmitting device. Since in the present embodiment the rotary member is used as the movable member, the second supplying section of the no-connection electricity supplying device provided on the rotary member may be concentric with the first supplying section of the same provided on the frame member and similarly the second transmitting section of the no-connection information transmitting device provided on the rotary member may be concentric with the first transmitting section of the same provided on the frame member. In the latter case, the first and second supplying sections are rotatable relative to each other about a common axis line thereof and are not movable relative to each other in a plane perpendicular to the common axis line and similarly the first and second transmitting are rotatable relative to each other about the same common axis line thereof and are not movable relative to each other in a plane perpendicular to the same common axis line. Thus, each of the no-connection electricity supplying device and the no-connection information transmitting device can enjoy a simple construction.

In another embodiment in accordance with the present invention, the at least two devices comprises the rotating device and the advancing and retracting device, the rotating device comprising, as the first actuator, a first electric motor for rotating the mounting head about the axis line thereof, the advancing and retracting device comprising, as the second actuator, a second electric motor for advancing and retracting the mounting head along the axis line thereof. In this embodiment, the second electric motor of the advancing and retracting device may comprise a housing, a nut which is provided in the housing such that the nut is rotatable about the axis line of the mounting head relative to the housing and is immovable relative to the housing in opposite directions parallel to the axis line, an externally threaded screw member which is threadedly engaged with the nut such that the screw member is not rotatable about the axis line relative to the housing and is movable relative to the housing in the opposite directions parallel to the axis line, a first rotor fixed to the nut, and a first electrically conductive coil which is provided in the housing, and the first electric motor of the rotating device may comprise a rotary member which is provided in the housing such that the rotary member is rotatable about the axis line relative to the housing and is immovable relative to the housing in the opposite directions parallel to the axis line, an axis member which is supported by the rotary member such that the axis member is not rotatable about the axis line relative to the rotary member and is movable relative to the rotary member in the opposite directions parallel to the axis line, the mounting head being connected to the axis member, a second rotor fixed to the rotary member, a second electrically conductive coil which is provided in the housing, and a connecting device which connects the axis member of the first motor with the screw member of the second motor such that the axis member is rotatable about the axis line relative to the screw member and is immovable in the opposite directions parallel to the axis line. In this embodiment, the EC mounting head is attached to the axis member. When the mounting head is moved along the axis line thereof, the coil of the second electric motor is energized, so that the rotor of the second motor is rotated and accordingly the nut is rotated. Consequently the screw member of the second motor is moved along the axis line thereof. Since the screw member is connected with the axis member by the connecting device such that the screw member is rotatable about the axis line thereof relative to the axis member and is immovable in the opposite directions parallel to the axis line. Therefore, as the screw member is moved along the axis line thereof, the mounting head is moved along the axis line thereof via the axis member of the second motor. When the mounting head is rotated about the axis line thereof, the coil of the first electric motor is energized, so that the rotor of the first motor is rotated and accordingly the rotary member is rotated. Consequently the axis member of the first motor is rotated about the axis line thereof. Thus, the mounting head connected to the axis member is rotated about the axis line thereof. When the two coils of the first and second motors are energized simultaneously, the EC mounting head is moved along the axis line thereof while simultaneously being rotated about the axis line. In the case where the first electric motor for rotating the EC mounting head about the axis line thereof and the second motor for moving the mounting head along the axis line are constructed as a unit as described above, the EC mounting apparatus enjoys a simpler construction.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 2:
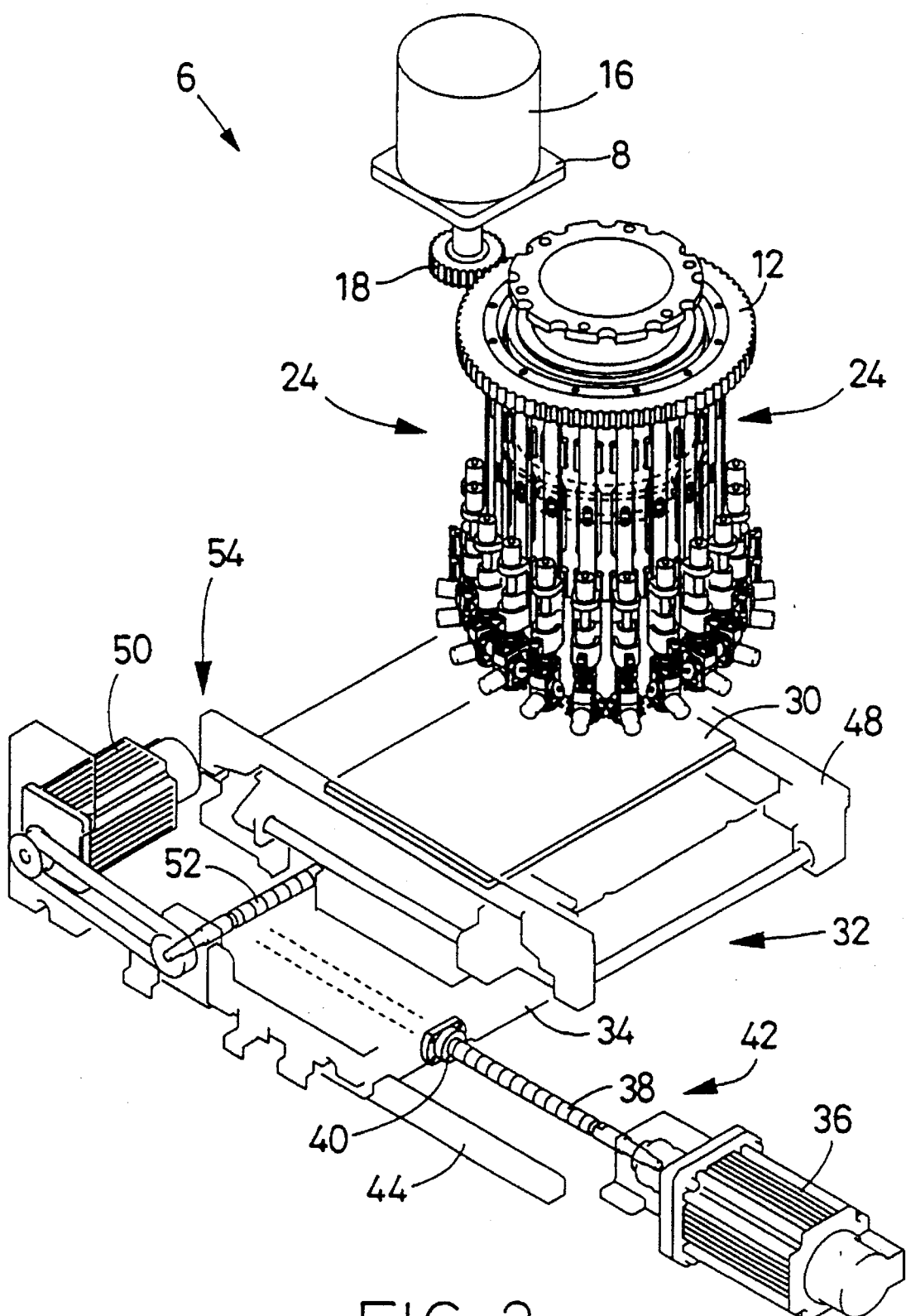
FIG. 2 is a perspective view showing the EC mounting apparatus of FIG. 1 together with a printed-circuit-board feeding device.

Referring first to FIG. 2, there is shown an electronic-component (EC) mounting apparatus 6 to which the present invention is applied. The EC mounting apparatus 6 includes a frame member 8 to which an index servo motor 16 is fixed.

Figure 1:
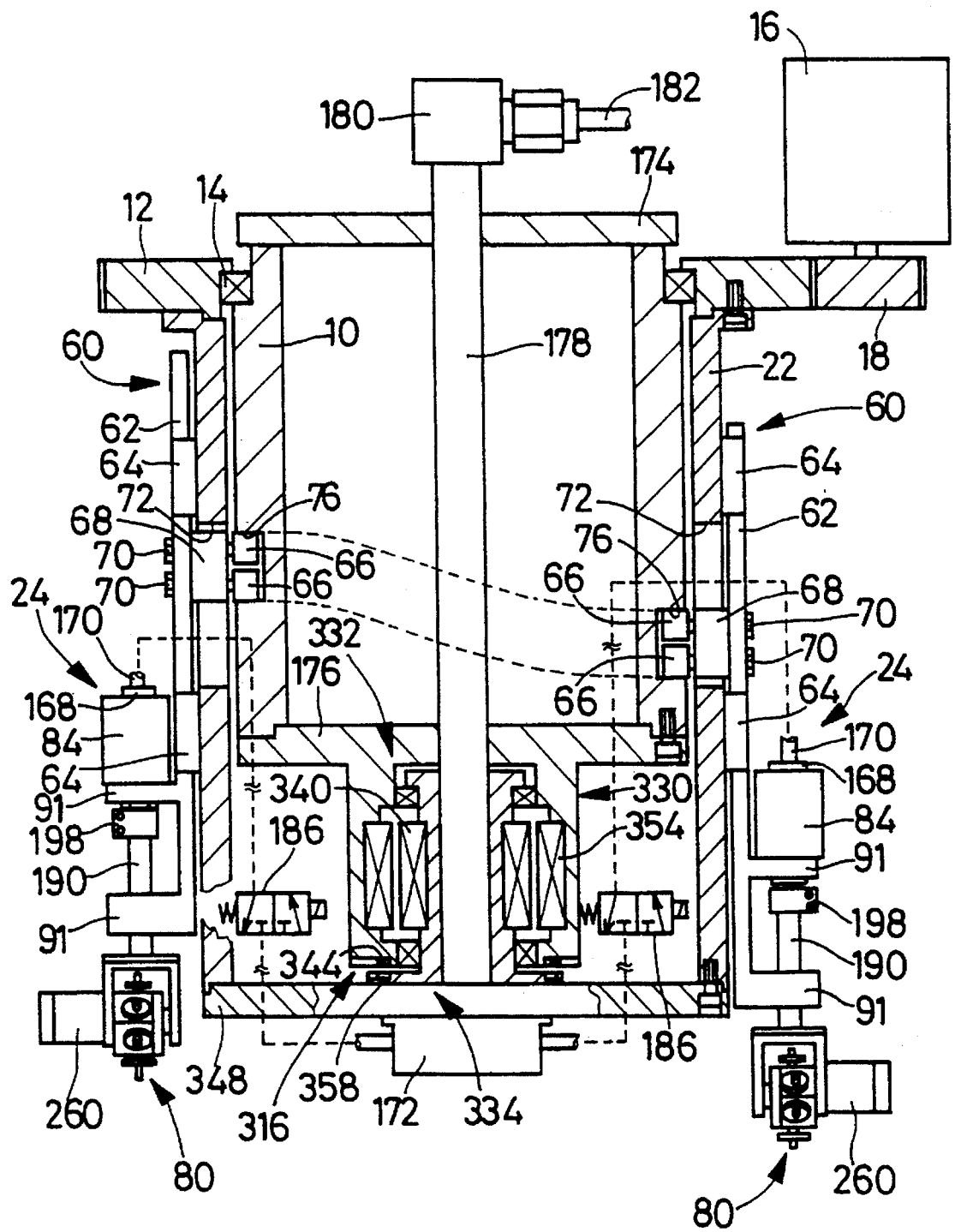
FIG. 1 is a cross-sectional elevation view of an electronic-component (EC) mounting apparatus embodying the present invention.

A cylindrical cam 10, shown in FIG. 1, is also fixed to the frame member 8 (not shown in FIG. 1). A large-diameter driven gear 12 is supported on a top portion of an outer surface of the cam 10 via a bearing 14, such that the driven gear 12 is rotatable about a vertical center line of the cam 10. The driven gear 12 is threadedly engaged with a drive gear 18 fixed to an output shaft of the index servo motor 16, which intermittently rotates the driven gear 12 by 18 degrees at one time.

Figure 3:
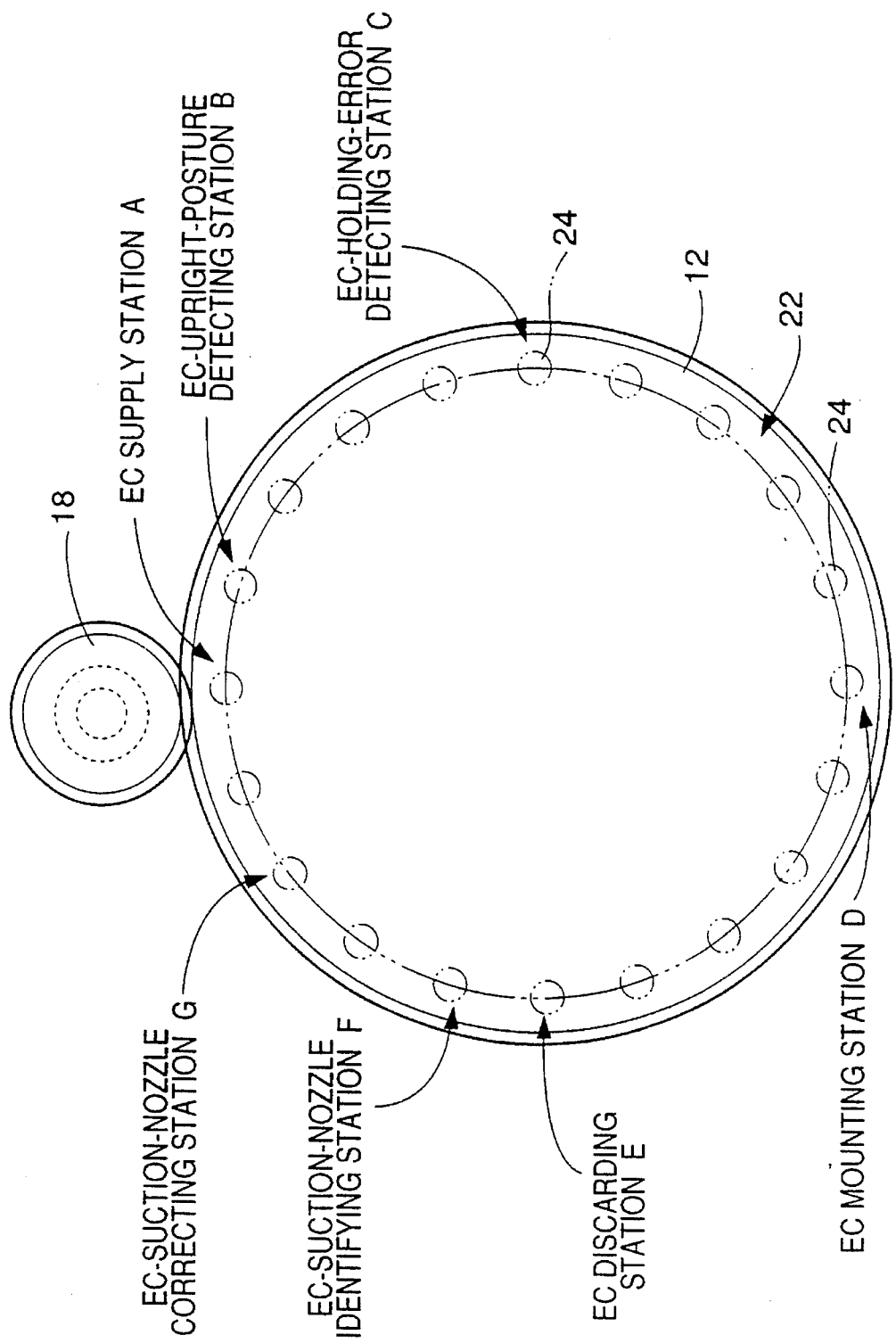
FIG. 3 is a diagrammatic view of various stations at which each of EC mounting units of the apparatus of FIG. 1 is stopped.

A cylindrical index rotor 22 is concentrically fixed to a lower surface of the driven gear 12. The index rotor 22 is externally fit on the cam 10. As shown in FIG. 3, twenty EC mounting units 24 are equiangularly attached to an outer surface of the index rotor 22, along a circle whose center rides on a rotation-axis line of the index rotor 22. Thus, each mounting unit 24 is sequentially moved to, and stopped at, each of twenty stations along the above circle, when the index rotor 22 is intermittently rotated.

The above twenty stations include three operating stations, i.e., EC supplying station, A, EC mounting station, D, and EC discarding station, E, and include four detecting stations, i.e., EC-upright-posture detecting station, B, EC-holding-error detecting station, C, EC-suction-nozzle identifying station, F, and EC-suction-nozzle correcting station, G.

At the EC supplying station A, there is provided an EC supplying device (not shown) which includes a table movable in a direction parallel to a tangential direction ("X direction") of the locus of rotation of the index rotor 22 and includes a plurality of EC supplying cartridges provided in an array extending in the direction of movement of the table. One of the EC supplying cartridges is moved to an EC supplying position, when the movable table is moved by a table-moving device (not shown).

Each EC supplying cartridge supplies each of electronic components (ECs) carried by an EC carrier tape, to an EC picking-up position. The EC carrier tape includes an array of EC accommodating pockets extending in a longitudinal direction thereof, and a cover film covering the respective openings of the pockets. The cartridge has an air cylinder as a drive source of a tape feeding device, which feeds the carrier tape in a Y direction perpendicular to the X direction in a horizontal plane, so that the EC accommodated in the leading pocket, or the leading one of the ECs accommodated in the pockets, from which the cover film has been removed, is fed to the EC picking-up position.

As shown in FIG. 2, at the EC mounting station D, there is provided a printed circuit board (PCB) moving device 32 which supports a PCB 30 as an object on which the ECs are mounted, and moves the same 30 in the X and Y directions. The PCB moving device 32 includes an X table 34 which can be moved in the X direction, by being guided by a guide rail 44, by an X moving device 42 including an X servo motor 36, a ball screw 38, a nut 40, etc.

On the X table 34, there is provided a Y table 48 which can be moved in the Y direction, by being guided by a guide rail (not shown), by a Y moving device 54 including a Y servo motor 50, a ball screw 52, etc. On the Y table 48, there is provided a PCB supporting and elevating device (not shown) which applies suction to the PCB 30, supports the same 30, and lifts up the same 30 from a PCB conveyer (not shown) which conveys PCBs in the X direction. The PCB 30 supported by the supporting and elevating device can be moved to any position on a horizontal plane by the combined movements of the X and Y tables 34, 48.

The PCB moving device 32 is provided at an elevation level lower than that at which the above-described EC supplying device is provided, and can move the PCB supporting and elevating device which supports a PCB 30 on a PCB support surface thereof, into below the EC supplying cartridges. Thus, the PCB moving device 32 can be used by being overlapped by the EC supplying device, and accordingly the present EC mounting apparatus 6 can be produced in a compact size.

As shown in FIG. 1, each of the twenty component-mounting units 24 is attached to the index rotor 22 with the help of a support member 60 including an elongate plate-like portion 62. The elongate portion 62 is fit in a pair of guide members 64 which are provided on the outer surface of the index rotor 22 and are remote from each other in a vertical direction, via respective bearings (not shown) provided between the elongate portion 62 and the two guide members 64. Thus, each support member 60 is immovable relative to the index rotor 22 in a plane perpendicular to the rotation-center line of the rotor 22, and is movable up and down by being guided by the guide members 64.

A cam follower in the form of a pair of rollers 66 are attached to an intermediate portion of the elongate portion 62 between respective portions of the same 62 fit in the two guide members 64. Two axis members about which the corresponding rollers 66 are rotatable extend through a roller-supporting plate 68 fixed to the elongate portion 62 and through the support member 60 (i.e., elongate portion 62). Nuts 70 are threadedly engaged with respective ends of the above axis members coming out of the support member 60. Thus, the two rollers 66 are attached to the elongate portion 62 such that the two rollers 66 are rotatable about respective axis lines perpendicular to the rotation-axis line of the index rotor 22 and such that the two rollers 66 are aligned with each other in a vertical direction.

Elongate holes 72 which vertically extend are formed through the cylindrical wall of the index rotor 22. Each roller-supporting plate 68 is provided within a corresponding elongate hole 72 such that the plate 68 is movable relative to the hole 72 or rotor 22 in a vertical direction. Each pair of rollers 66 are rotatably fit in a cam groove 76 formed in the outer surface of the cam 10. As shown in FIG. 1, the elevation level of the cam groove 76 gradually changes in the outer surface of the cam 10. When the index rotor 22 is rotated and the EC mounting units 24 are intermittently moved, the rollers 66 are moved in the cam groove 76, so that each unit 24 is moved up and down. More specifically, the cam groove 76 is designed such that each unit 24 is moved up to an uppermost position thereof at the EC supplying station A and is moved down to a lowermost position thereof at the EC mounting station D.

Each of the twenty EC mounting units 24 includes an EC mounting head 80 and a Z.θ drive motor 84 for moving the head 80 up and down and rotating the head 80 about a vertical axis line thereof.

Figure 4:
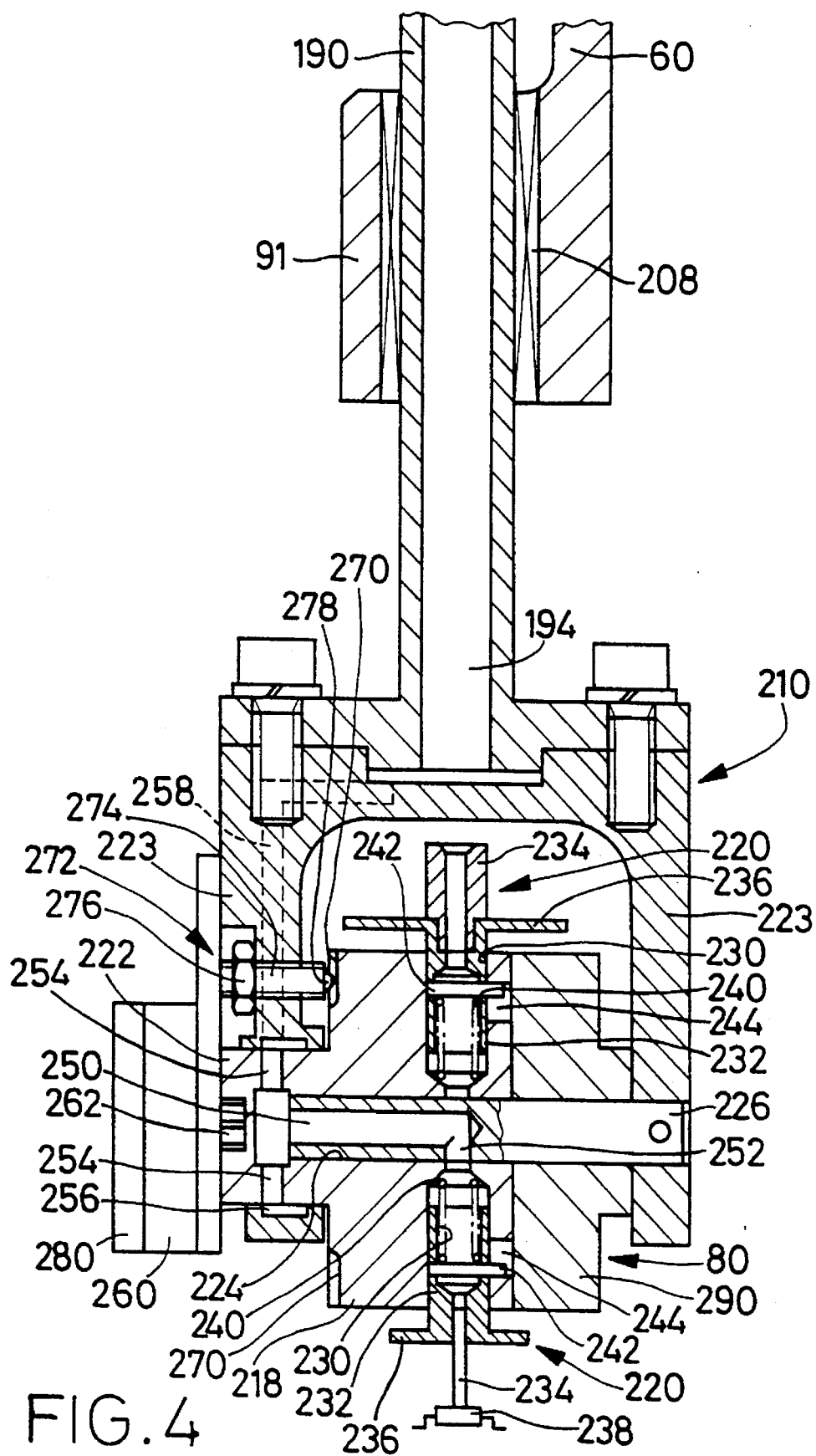
FIG. 4 is a cross-sectional elevation view of a EC mounting head of each of the EC mounting units of the apparatus of FIG. 1.
Figure 6:
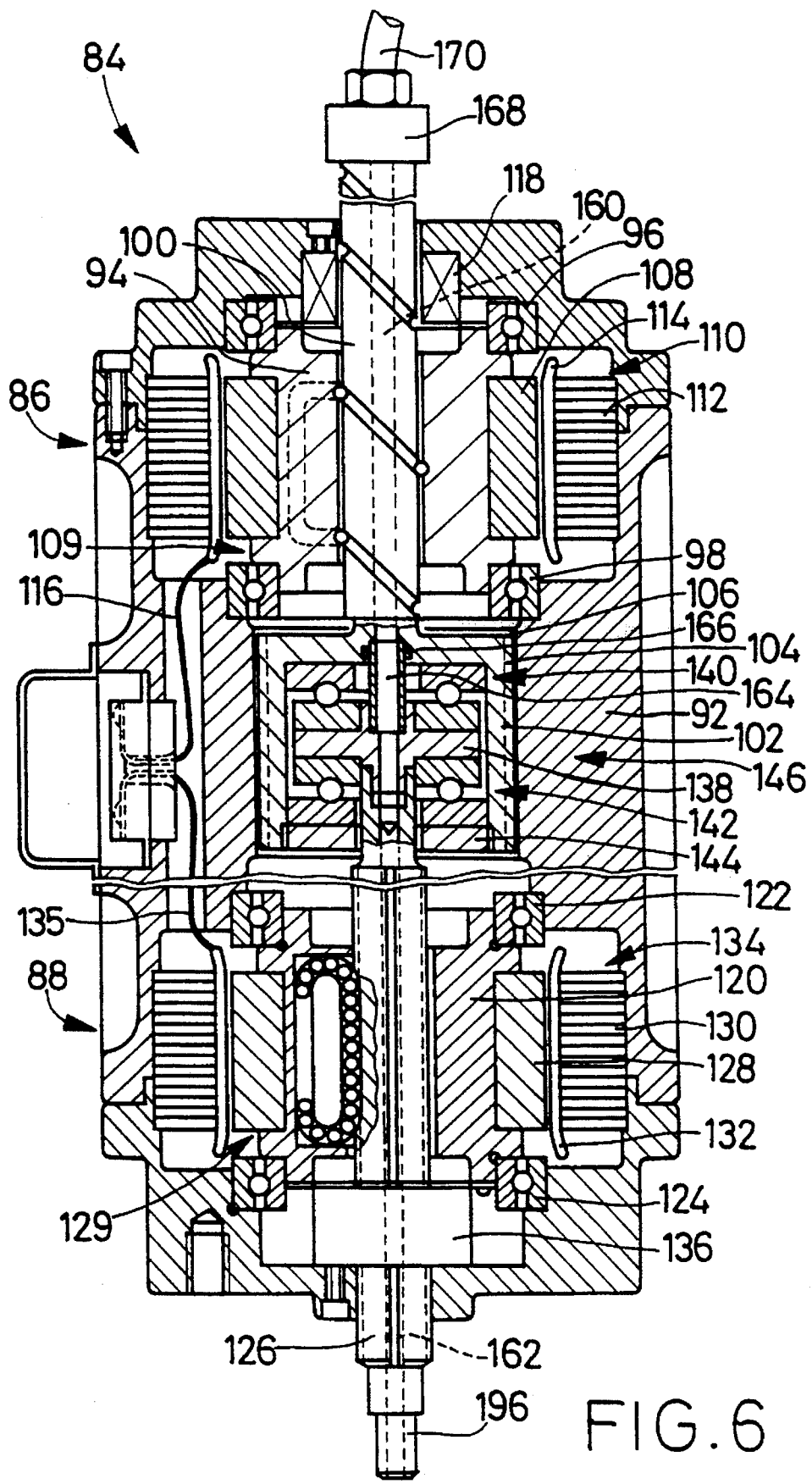
FIG. 6 is a cross-sectional elevation view of the Z.θ drive motor of FIG. 5.

The Z.θ drive motor 84 has a construction as shown in FIG. 6, i.e., includes a Z servo motor 86 corresponding to an upper half of the motor 84, and a θ servo motor 88 corresponding to a lower half of the motor 84, each of which is provided as an integral part of the motor 84. Each servo motor 86, 88 is an AC servo motor (i.e., brushless DC servo motor). As shown in FIGS. 1 and 4, a housing 92 of the Z.θ drive motor 84 is fixed to an upper one of a pair of arm portions 91 of the support member 60 projecting from the elongate portion 62 of the same 60.

First, the Z servo motor 86 is described below.

As shown in FIG. 6, a nut 94 is supported by a top portion of the housing 92 via bearings 96, 98, such that the nut 94 is rotatable about a vertical axis line. A ball screw 100 is threadedly engaged with the nut 94, and includes a cylindrical, bearing-holding portion 102 at a lower end thereof. Splines 104 are formed on an outer surface of the bearing-holding portion 102, and are engaged with spline holes 106 formed in the housing 92. Thus, the rotation of the ball screw 100 is inhibited. The bearing-holding portion 102 will be described in more detail later.

A permanent magnet 108 is fixed to an outer surface of the nut 94, thereby providing a rotor 109 of the AC servo motor. The permanent magnet 108 has a cylindrical shape in which N and S poles are arranged alternately.

A stator core 110 is provided inside the housing 92. The stator core 110 is provided by a plurality of coils 114 accommodated in a laminated core 112. In the present embodiment, the stator core 110 is driven in three phases. A servo driver (not shown) is connected to the coils 114 via a conducting wire 116. The servo driver controls the electric current supplied to the coils 114, thereby controlling the rotation amounts of the rotor 109 and the nut 94 and controlling the movement amount of the ball screw 100 in an axial direction thereof.

A Z-position detector 118 which detects a Z-direction position of the ball screw 100 in a Z direction perpendicular to the X and Y directions, is provided between the nut 94 and the housing 92, and supplies a detection value as operation information of the Z servo motor 86, to an actuator control circuit 312 (FIG. 8) which controls the rotation of the nut 94 by controlling the electric current supplied to the coils 114 based on this operation information and command information supplied from a machine controller 310 which will be described later. The nut 94 can be rotated in opposite directions by desired angular amounts at desired rotation speeds. The control of electric current supplied to the coils 114 will be described in detail later.

Next, the θ servo motor 88 is described below.

A ball spline member 120 is accommodated in a lower portion of the housing 92 such that the ball spline member 120 is supported by bearings 122, 124 and is rotatable concentrically with the ball screw 100. A spline axis 126 is fit in the ball spline member 120, and the rotation of the ball spline member 120 is transmitted to the spline axis 126.

A permanent magnet 128 similar to the permanent magnet 108 is fixed to an outer surface of the ball spline member 120, thereby providing a rotor 129. A stator core 134 similar to the stator core 110 is provided by coils 132 accommodated in a laminated core 130, inside the housing 92, and is driven in three phrases. A servo driver (not shown) is connected to the coils 132 via a conducting wire 135. The servo driver controls the electric current supplied to the coils 132, thereby controlling the rotation amount of the ball spline member 120 and controlling the rotation amount of the spline axis 126. A θ-position detector 136 which detects an angular position of the spline axis 126 about a rotation axis line thereof, is provided between the spline axis 126 and the housing 92, and supplies a detection value as operation information of the θ servo motor 88, to the actuator control circuit 312 which controls the rotation of the spline axis 126 by controlling the electric current supplied to the coils 132 based on this operation information and command information supplied from the machine controller 310.

The spline axis 126 includes, in a top portion thereof, a radially outwardly extending flange portion 138 which is fit in the bearing-holding portion 102 of the ball screw 100. Two bearings 140, 142 are provided on upper and lower sides of the flange portion 138, respectively, and a lid member 144 is threadedly engaged with an opening of the bearing-holding portion 102. Thus, the flange portion 138 is connected to the bearing-holding portion 102 via the bearings 140, 142, and the ball screw 100 and the spline axis 126 are connected to each other such that the two members 100, 126 are rotatable relative to each other and are immovable relative to each other in the axial direction thereof. In the present embodiment, the bearing-holding portion 102, flange portion 138, bearings 140, 142, and lid member 144 cooperate with one another to provide a connecting device 146.

When the Z servo motor 86 is operated, the ball screw 100 and the spline axis 126 are moved vertically as a unit; and when the θ servo motor 88 is operated, the spline axis 126 is rotated relative to the ball screw 100. If an electric current is applied to the coils 114 and the coils 132, at different timings, the above vertical movement and the above relative rotation occur at the different timings. On the other hand, if an electric current is simultaneously applied to both the coils 114 and the coils 132, the vertical movement and the relative rotation occur simultaneously. The spline axis 126 has a sufficient length ensuring that the spline axis 126 does not completely come out of the ball spline member 120 when the EC mounting head 80 is moved up and down.

An axial passage 160 is formed through the central portion of the ball screw 100, and an axial passage 162 is formed through the central portion of the spline axis 126. An upper end portion of a joint sleeve 164 is fit via a seal member 166 in a lower opening of the passage 160, and a lower end portion of the joint sleeve 164 is press-fit in an upper opening of the passage 162.

The passage 160 is connected to a rotary joint 172 via a joint member 168 and a hose 170. As shown in FIG. 1, the cylindrical cam 10 has an axis member 178 which extends through a top plate 174 closing an upper opening of the cam 10, and through a bottom plate 176 closing a lower opening of the cam 10. A vacuum supplying passage 179 (FIG. 11) is formed through the axis member 178, and is connected to a vacuum source (not shown) via a joint member 180 and a hose 182. The rotary joint 172 is attached to the bottom end of the axis member 178 such that the joint 172 is rotatable relative to the axis member 178. When the index rotor 22 is rotated, the angular position of the rotary joint 172 relative to the axis member 178 is changed, but the fluid communication of the joint 172 with the vacuum passage 179 is maintained.

The hose 170 connects between one of twenty air outlets 184 (FIG. 11) formed in the rotary joint 172, and the passage 160, and a solenoid-operated direction-switching valve 186 is provided midway in the hose 170. When the solenoid valve 186 is switched, the passages 160, 162 are selectively communicated with the vacuum source or the ambient atmosphere. In FIG. 1, the solenoid valves 186 are seen to be separate from the index rotor 22, for the purpose of easier understanding only. In fact, the solenoid valves 186 are fixed to the index rotor 22.

Figure 5:
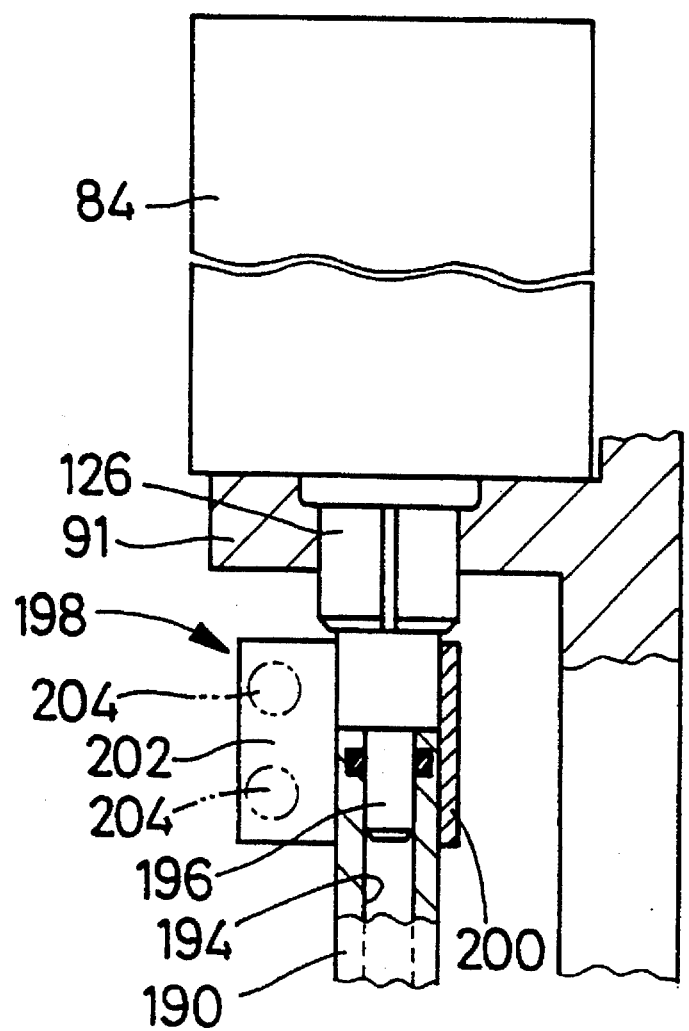
FIG. 5 is a partly cross-sectional elevation view of a part of the EC mounting head connected to a Z.θ drive motor of the EC mounting unit.

An attachment member 190 to which the component mounting head 80 is attached, is removably fixed to a bottom end of the spline axis 126. As shown in FIGS. 4 and 5, a passage 194 is formed through an axis line of the attachment member 190, and the attachment member 190 is integrally joined with the spline axis 126 with the help of a joining member 198 such that an upper end of the attachment member 190 is fit on a projecting portion 196 projecting downward from the bottom end of the spline axis 126.

The joining member 198 includes a C-shaped portion 200, and two arm portions 202 projecting from a pair of ends of the C-shaped portion 200. The C-shaped portion 200 is fit on both the spline axis 126 and the attachment member 190, and the pair of arm portions 202 are connected to each other with screws 204, so that the spline axis 126 and the attachment member 190 are integrally joined with each other.

As shown in FIGS. 1 and 4, the attachment member 190 is fit via a bearing 208 in a lower one of the pair of arm portions 91 of the support member 60, such that the attachment member 190 can be moved up and down and can be rotated relative to the support member 60. An inverted-U-shaped support member 210 is fixed to a lower end of the attachment member 190 projecting downward from the lower arm portion 91, and the EC mounting head 80 is attached to the support member 210 and is moved up and down and rotated by the Z,θ drive motor 84.

As shown in FIG. 4, the EC mounting head 80 includes a nozzle holder 218, and six EC-suction nozzles 220 held by the nozzle holder 218. The nozzle holder 218 has an axis portion 222 on the side of one of opposite ends thereof. The axis portion 222 is fit in one of side walls 223 of the inverted-U-shaped support member 210, such that the nozzle holder 218 is rotatable about a horizontal axis line thereof. The nozzle holder 218 has a hole 224 which is coaxial with the axis portion 222 and opens on the side of the other end of the holder 218. An axis member 226 is fit in the hole 224 such that the nozzle holder 218 is rotatable about the axis member 226. The axis member 226 is fixed to the other side wall 223 of the support member 210. Thus, the nozzle holder 218 is supported by the support member 210 and the axis member 226 such that the holder 218 is rotatable about the horizontal axis line thereof.

Figure 7:
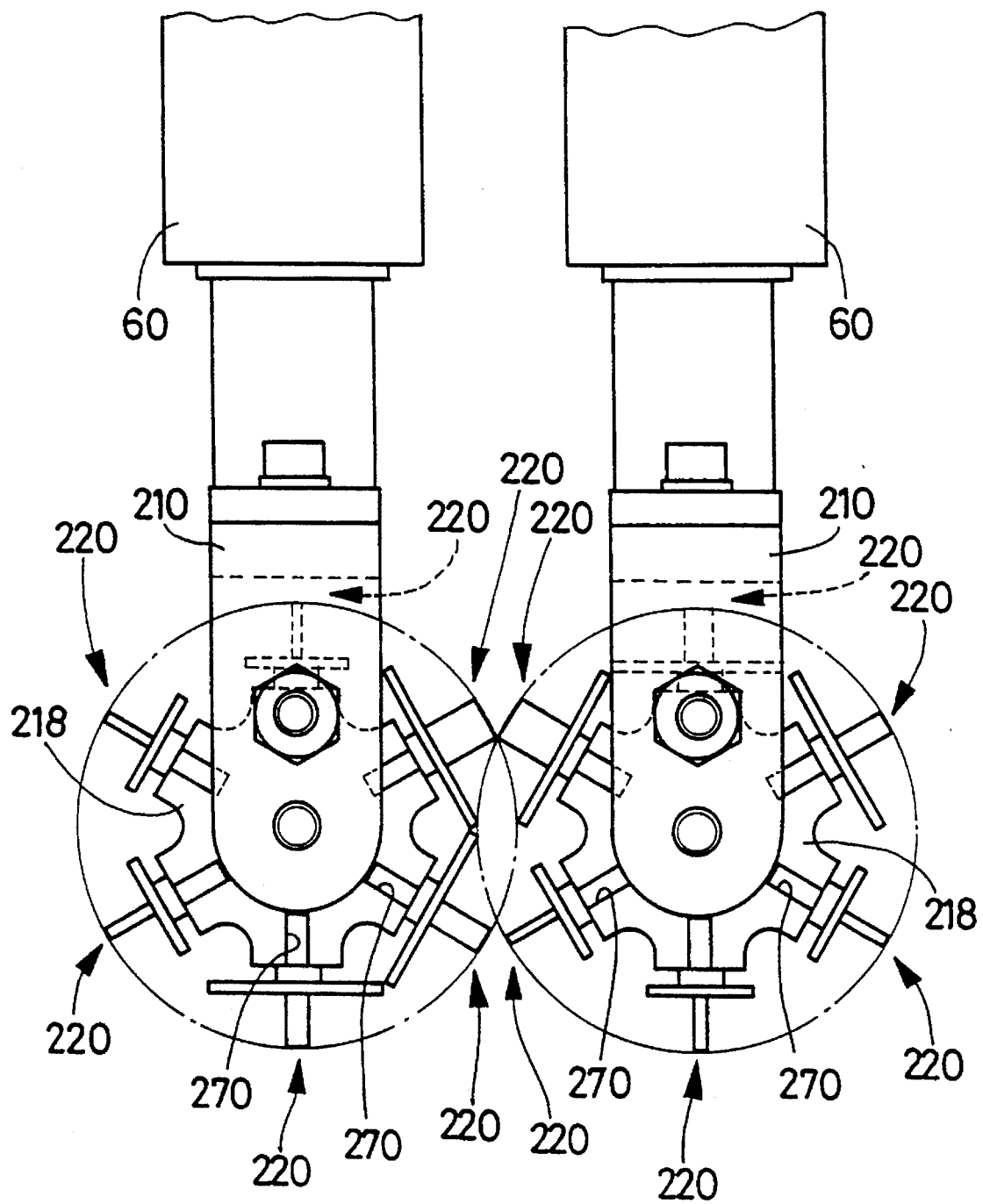
FIG. 7 is an elevation view of respective EC mounting heads of two adjacent EC mounting units of the apparatus of FIG. 1.

Six nozzle receiving holes 230 are formed in the nozzle holder 218 such that the holes 230 extend radially outwardly of the rotation axis line of the holder 218 and are equiangularly distant from one another around the axis line. Six EC suction nozzles 220 are fit in the corresponding holes 230, as shown in FIGS. 4 and 7. Each suction nozzle 220 includes a suction-pipe holder 232, and a suction pipe 234 fit in the suction-pipe holder 232. A luminous plate 236 is attached to the suction-pipe holder 232.

The luminous plate 236 absorbs ultraviolet rays emitted by an ultraviolet-ray emitter of an image picking-up device provided at the EC-holding-error detecting station C. The suction pipe 234 and the luminous plate 236 have respective sizes corresponding to the size of an electronic component (EC) 238 to be picked up. As shown in FIG. 7, the six suction nozzles 220 held by the nozzle holder 218 are adapted to pick up ECs 238 having different sizes, respectively. The six suction pipes 234 have six different diameters, respectively, and the six luminous plates 236 have two different sizes.

Each suction nozzle 220 is biased by a spring 240 provided in the nozzle receiving hole 230, in a direction in which the nozzle 220 comes out of the hole 230. A pin 242 is fit diametrically in the suction-pipe holder 232, and is engaged with a pin-engaging groove 244 formed in the nozzle holder 218. Thus, the suction nozzle 220 is prevented from coming out of the nozzle holder 218 and is inhibited from being rotated about an axis line thereof.

The pin-engaging groove 244 opens in a bottom surface and a side surface of the nozzle holder 218, and communicates with the nozzle receiving hole 230. Thus, the groove 244 is generally J-shaped. When the suction-pipe holder 232 is fit in the nozzle-receiving hole 230, first, the pin 242 is fit in the pin-engaging groove 244. After the suction-pipe holder 232 is fit and subsequently is rotated, worker's pressing force being applied to the holder 232 is released, so that the holder 232 is biased by the spring 240 and the pin 242 is engaged with one end surface of the groove 244. Thus, the suction nozzle 220 is held by the nozzle holder 218 such that the nozzle 220 cannot be removed from the hole 230 and cannot be rotated about the axis line thereof.

The EC suction nozzle 220 holds the EC 238, by utilizing negative pressure or vacuum which is supplied thereto through the following route:

The axis member 226 on which the nozzle holder 218 is rotatably supported has an axial passage 250 which axially extends to one of opposite axial ends thereof and opens at that end whose position corresponds to the axis portion 222 of the nozzle holder 218, and a radial passage 252 which extends downward from the axial passage 250.

The axial passage 250 communicates with the passage 194 formed in the attachment member 190 via a plurality of radial passages 254 formed in the axis portion 222 of the nozzle holder 218 and via an annular passage 256 and a passage 258 formed in the inverted-U-shaped support member 210. Thus, the axial passage 250 is selectively communicated with the vacuum source and the atmospheric pressure, by operating the solenoid-operated direction-switching valve 186.

The nozzle holder 218 is rotated by a nozzle-selecting servo motor 260 attached to the support member 210. Like the Z.θ drive servo motor 84, the nozzle-selecting servo motor 260 is provided by a brushless servo motor. The servo motor 260 is attached to the support member 210 such that an output shaft 262 of the servo motor 260 is coaxial with the axis line of rotation of the nozzle holder 218. The output shaft 262 is spline-fit in the axis portion 222 of the nozzle holder 218. The nozzle holder 218 is rotated by the nozzle-selecting servo motor 260, so that a selected one of the six EC suction nozzles 200 is moved to an EC suction position where the suction pipe 234 of the selected nozzle 200 faces downward. The nozzle receiving hole 230 for the selected nozzle 220 which has been moved to the EC suction position, communicates with the radial passage 252 formed in the axis member 226, so that when the negative pressure is supplied to the hole 230, the nozzle 220 can hold the EC 238 by the negative pressure.

The support member 210 is rotated by the Z.θ drive servo motor 84, as described previously. Since the maximum rotation amount of the support member 210 is about 180 degrees, a drive current is supplied to the nozzle-selecting servo motor 260 via a conducting wire (not shown). The drive current supplied via the conducting wire is controlled by a nozzle-selecting-servo-motor control device 302 mounted on the index rotor 22. The control device 302 will be described in detail later.

The angular positions of the nozzle holder 218 are defined by six notches 270 formed on the nozzle holder 218 and a positioning device 272 provided on the support member 210. The notches 270 are V grooves which are formed in one end surface of the holder member 218 such that the V grooves radially outwardly extend from the axis line of rotation of the nozzle holder 218. The positioning device 272 includes a main member 274 provided by an externally threaded screw having an axial hole formed therein. The main member 274 is threadedly engaged with the side wall 223 of the support member 210, and is fixed with a lock nut 276, so that the position of the main member 274 is axially adjustable relative to the side wall 223. The axial hole of the main member 274 opens in one end surface thereof opposed to the nozzle holder 218, and a ball member 278 is provided in the opening of the axial hole such that the ball member 278 is partly exposed and is prevented from completely coming out of the opening. A compression coil spring (not shown) provided in the main member 274 biases the ball member 278 in a direction in which the ball member 278 comes out of the opening. The nozzle holder 218 is positioned relative to the support member 210, by fitting the ball member 278 in a selected one of the six notches 270. The notches 270 and the positioning device 272 (or main member 274) are provided at respective positions which ensure that when the ball member 278 is fit in each of the notches 270, a corresponding one of the suction nozzles 220 is positioned at the EC suction position.

The angular position of the nozzle-selecting servo motor 260 is detected by a nozzle-selection detector 280 like the Z-position detector 118 and the θ-position detector 136. Based on the operation information supplied from the nozzle-selection detector 280 and command information supplied from the main controller 310, the actuator control circuit 312 controls the rotation of the nozzle-selecting servo motor 260, so that a desired one of the suction nozzles 220 is positioned at the EC suction position.

A plate member 290 is fixed to an end surface of the nozzle holder 218 which surface is opposite to the other end surface of the same in which the notches 270 are formed. The plate member 290 contacts the other side wall 223 of the support member 210, thereby preventing the nozzle holder 218 from moving in a direction parallel to the axis line of rotation of the nozzle holder 218. A portion of the axis member 226 between the nozzle holder 218 and the second side wall 223 is fit in the plate member 290 such that the axis member 226 and the plate member 290 are rotatable relative to each other. Six groups of reflecting members (not shown) each group of which consists of three reflecting members are provided equiangularly about the axis member 226, in an end surface of the plate member 290 which is opposite to the other end surface of the same at which the plate member 290 is fixed to the nozzle holder 218. Each of the eighteen reflecting members has a white or black color, and the pattern of the white and/or black colors of each group of reflecting members is different from those of the other groups. The six groups of reflecting members are provided at respective positions which correspond to the six suction nozzles 220 in the direction of rotation of the nozzle holder 218.

An EC-suction-nozzle identifying device (not shown) is provided at each of the EC-suction-nozzle identifying station F and the EC-suction-nozzle correcting station G. The EC-suction-nozzle identifying device has three pairs of optical-fiber sensors each pair of which includes a light emitting fiber and a light receiving fiber. The six optical fibers are arranged in an array extending vertically, and each light-emitting fiber emits a light beam to a light reflecting surface of the EC mounting head 80 which has been moved to the EC-suction-nozzle identifying station F or the EC-suction-nozzle correcting station G. The identifying device produces EC-suction-nozzle data indicative of the selected EC suction nozzle 220 positioned at the EC suction position, based on the combination of the strong and weak intensities of the light beams reflected from the EC mounting head 80.

Figure 8:
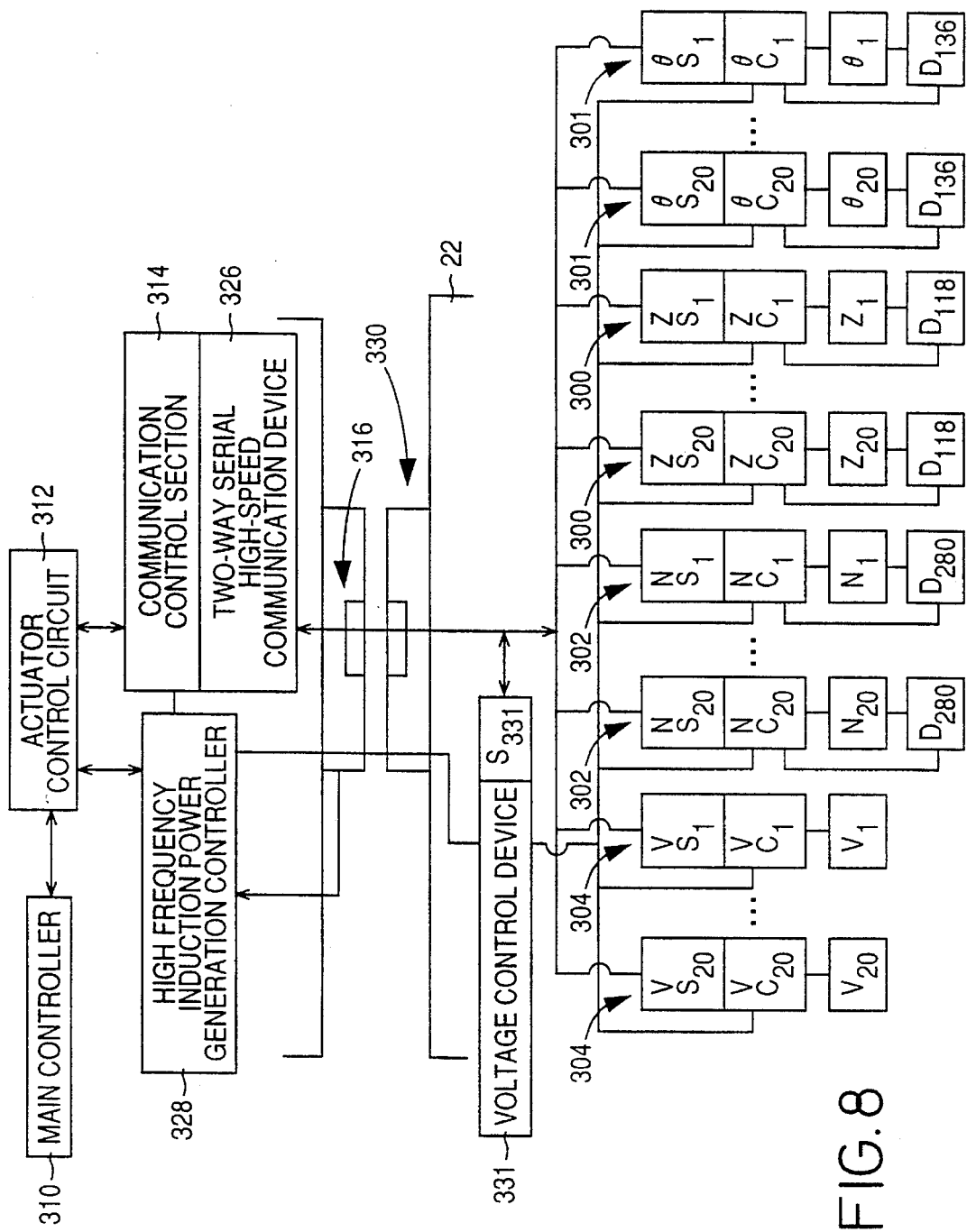
FIG. 8 is a diagrammatic view of respective electric constructions of the apparatus of FIG. 1 for supplying electric energy to the EC mounting units, transmitting information to the same, and controlling various actuators of the EC mounting units.

As illustrated in FIG. 8, the index rotor 22 supports, for each of the twenty EC mounting units 24, a Z-servo-motor control device 300 for controlling the Z servo motor 86, a θ-servo-motor control device 301 for controlling the θ servo motor 88, a nozzle-selecting-servo-motor control device 302 for controlling the nozzle-selecting servo motor 260, and a switching-valve control device 304 for controlling the solenoid-operated direction-switching valve 186. Each of the four control devices 300, 301, 302, 304 includes a communication section, S, which receives information needed to control a corresponding actuator 86, 88, 260, 186 and transmits information related to the operation of the actuator 86, 88, 260, 186, and a control/drive section, C, which controls electric energy supplied from a power source 306 (FIG. 9) fixed to the frame member 8, based on the information received by the communication section S, and thereby controls the actuator 86, 88, 260, 186.

In order to distinguish the communication section S and control/drive section C of each one of the control devices 300, 301, 302, 304 of each one of the twenty EC mounting units 24, from the sections S, C of the control devices 300, 301, 302, 304 of the other units 24, the respective communication sections S of the twenty Z-servo-motor control devices 300 are indicated at $ZS_1$ to $ZS_{20}$ in FIG. 8; the control/drive sections C of the twenty Z-servo-motor control devices 300 are indicated at $ZC_1$ to $ZC_{20}$; the sections S and C of the twenty θ-servo-motor control devices 301 are indicated at $\theta S_1$ to $\theta S_{20}$ and $\theta C_1$ to $\theta C_{20}$; the sections S and C of the twenty nozzle-selecting-servo-motor control devices 302 are indicated at $NS_1$ to $NS_{20}$ and $NC_1$ to $NC_{20}$; and the sections S and C of the twenty switching-valve control devices 304 are indicated at $VS_1$ to $VS_{20}$ and $VC_1$ to $VC_{20}$. In FIG. 8, the symbols, Z, represent the Z servo motors 86; the symbols, θ, represent the θ servo motors 88; the symbols, N, represent the nozzle-selecting servo motors 260; and the symbols, V, represent the direction-switching valves 186. The symbols, $D_{118}$, $D_{136}$, and $D_{280}$ represent the Z-position detectors 118, the θ-position detectors 136, and the nozzle-selection detectors 280.

The frame member 8 supports a main controller 310 for controlling all the devices that are related to the mounting of the ECs 238 on the PCB 30, e.g., the EC supplying device, the EC mounting apparatus 6, and the PCB feeding device 32. The main controller 310 is essentially provided by a computer, and controls respective actuators of the EC supplying device, EC mounting apparatus 6, and PCB feeding device 32, via respective control circuits which are not shown in FIG. 8 except the actuator control circuit 312 for controlling the actuators of the EC mounting apparatus 6 mounted on the index rotor 22.

The main controller 310 supplies, to the actuator control circuit 312, command information needed to control the actuators 84, 86, 260, 186 of each of the twenty EC mounting units 24, and the command information is transmitted by a two-way serial high-speed communication device 326 of a communication control section 314, to the communication sections $ZS_1$ to $ZS_{20}$, $\theta S_1$ to $\theta S_{20}$, $NS_1$ to $NS_{20}$, and $VS_1$ to $VS_{20}$, via a no-connection information transmitting device 316.

Figure 9:
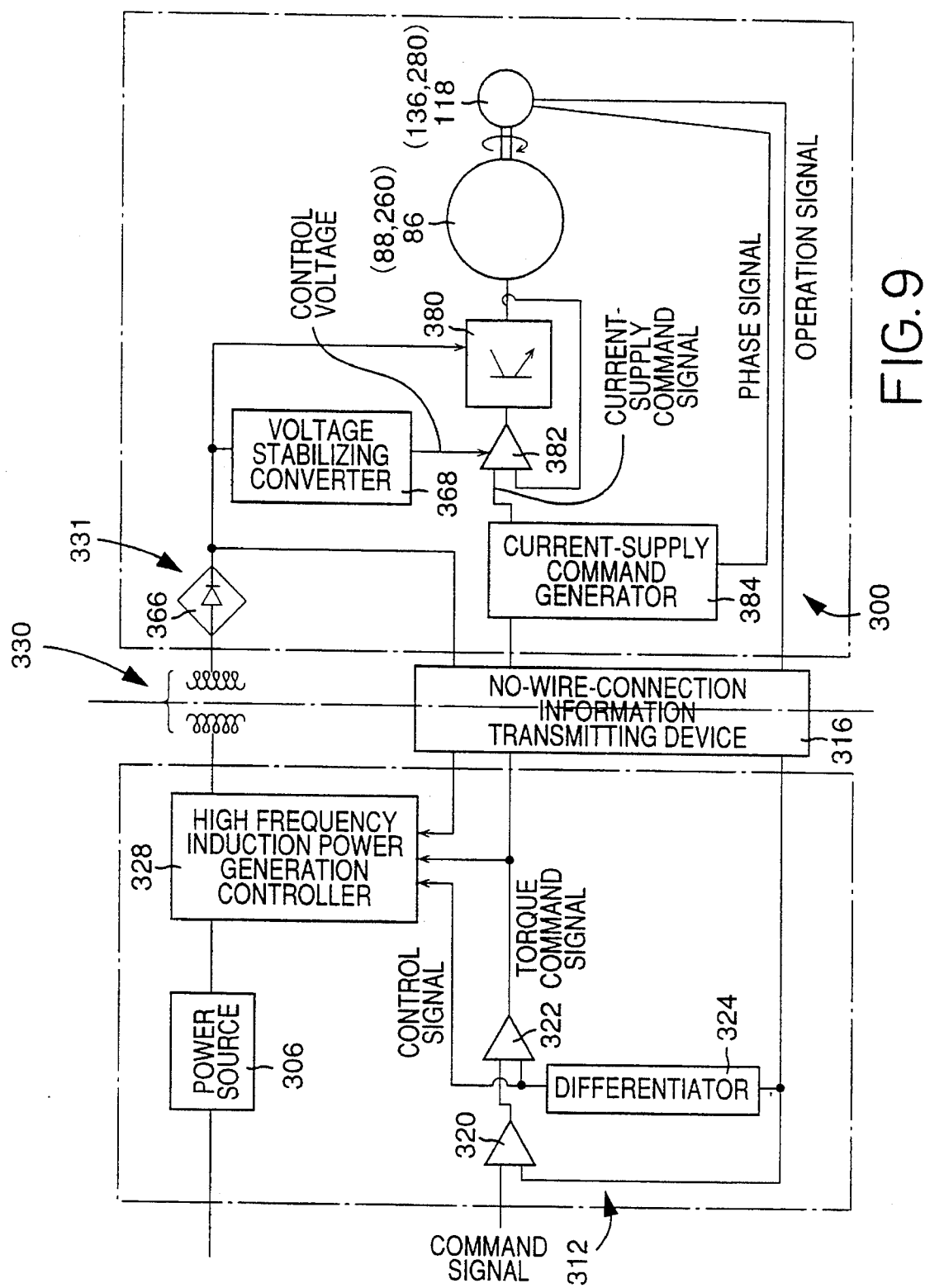
FIG. 9 is a diagrammatic view of a control circuit for controlling a servo motor employed in the apparatus of FIG. 1.

FIG. 9 shows a control circuit for controlling one of the Z servo motors 86. However, in FIG. 9, the communication control section 314, and the communication section ZS of the Z-servo-motor control device 300 for the Z servo motor 86 are not shown for the purpose of easier understanding only. Since each of the θ servo motors 86 and the nozzle-selecting servo motors 260 has a control circuit similar to that shown in FIG. 9, the description thereof is omitted.

The actuator control circuit 312 includes a position amplifier 320, a speed amplifier 322, and a differentiator 324. The position amplifier 320 receives a command signal in the form of an analog signal converted from command information in the form of a digital signal supplied from the main controller 310, and an operation signal as operation information supplied from the Z-position detector 118. The speed amplifier 322 receives the output signal of the position amplifier 320, and a control signal which is produced by the differentiator 324 by differentiating the output signal of the Z-position detector 118. The two amplifiers 320, 322 cooperate with each other to produce a torque command signal based on the above-indicated command signal and the respective values represented by the feedback operation and control signals. This torque command signal is supplied to the Z-servo-motor control device 300 provided on the index rotor 22, via the no-connection information transmitting device 316 including a frame-side communication coil 344 and a rotor-side communication coil 358 (FIG. 11) which will be described later.

The drive current to drive the Z servo motor 86 (in fact, together with the respective drive currents to drive the θ servo motor 88, direction-switching valve 186, and nozzle-selecting servo motor 260) is supplied from the power source 306 to a voltage control device 331 provided on the index rotor 22, via a high frequency induction power generation controller 328 and a no-connection electric-power supplying device 330.

Figure 11:
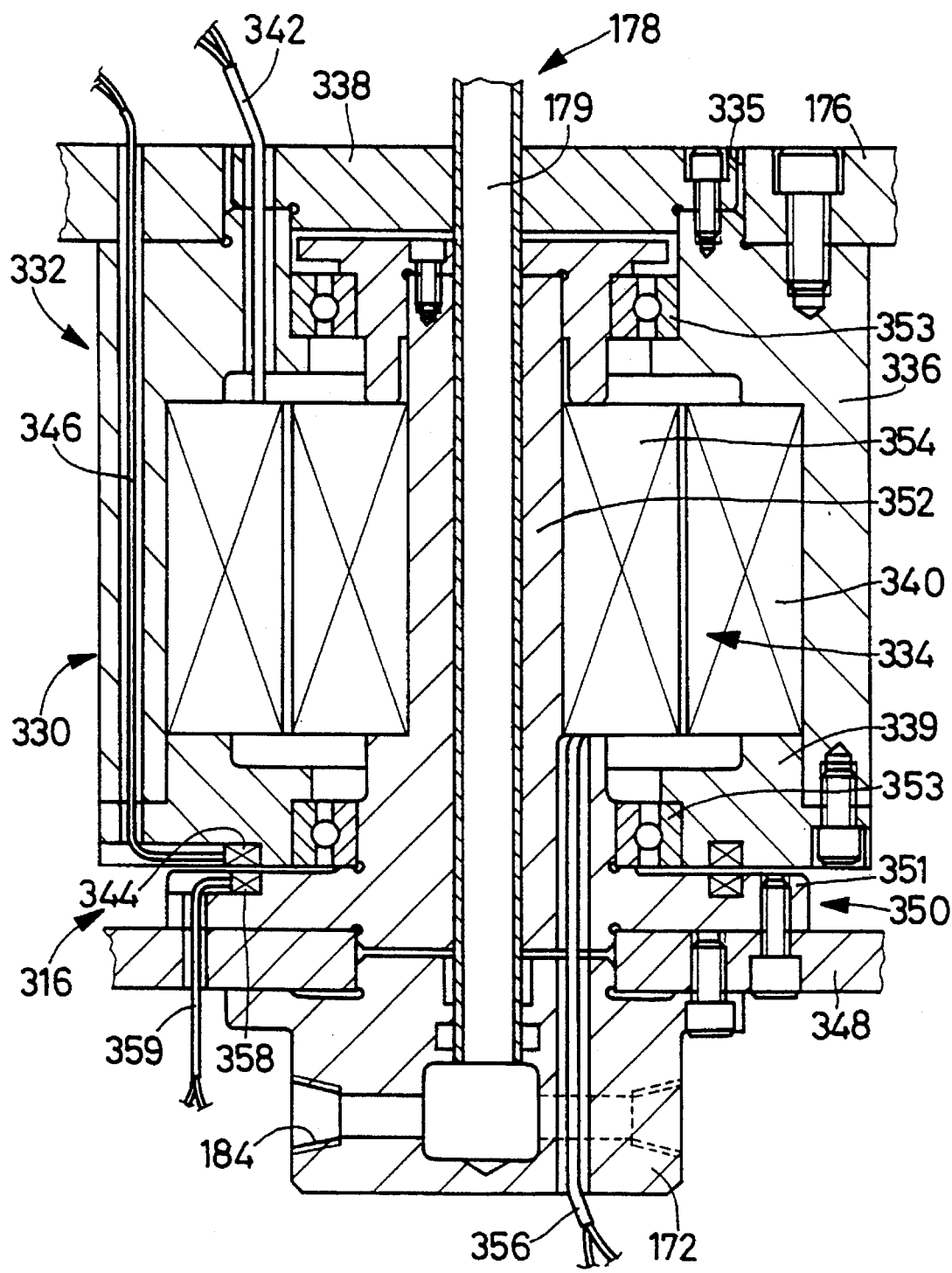
FIG. 11 is an enlarged cross-sectional elevation view of a no-connection electric power supplying device and a no-connection information transmitting device of the apparatus of FIG. 1.
Figure 12:
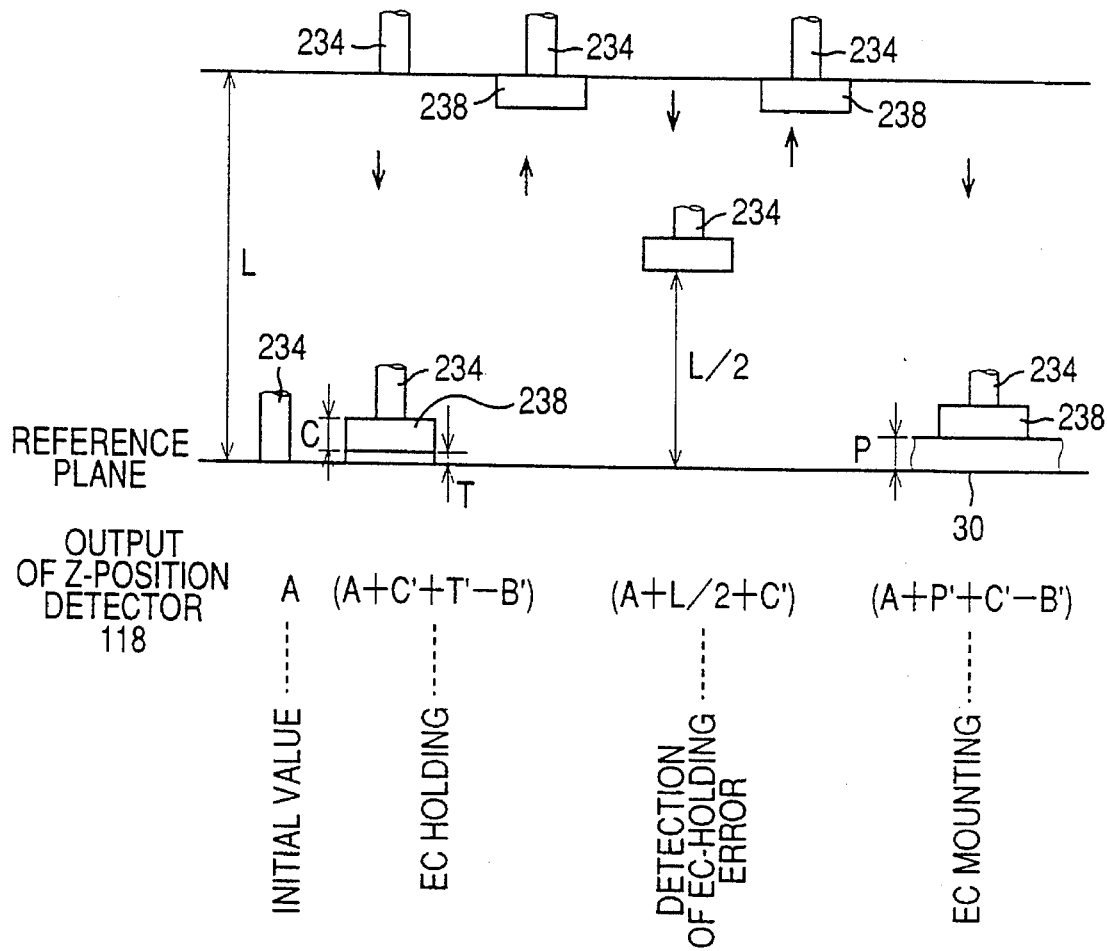
FIG. 12 is an illustrative view for showing the upward and downward movements of each of the EC mounting heads of the apparatus of FIG. 1.

As shown in FIG. 1, the no-connection electric-power supplying device 330 includes an electric-power supply 332 attached to the cylindrical cam 10, and an electric-power receiver 334 attached to the index rotor 22. As shown in FIG. 11, the bottom plate 176 fixed to the lower opening of the cam 10 has an opening 335 whose center rides on the center line of the cam 10. A cylindrical holder member 336 is fixed to a lower surface of the bottom plate 176 such that the cylindrical holder 336 is coaxial with the cylindrical cam 10. An upper opening of the holder member 336 is closed by a closure plate 338 which is provided within the opening 335 of the bottom plate 176, and an annular support plate 339 is fixed to a lower opening of the holder member 336. After assembling, the holder member 336, closure plate 338, and support plate 339 cooperate with one another to provide an integral housing for accommodating the electric-power supply 332. In FIG. 1, the three members 336, 338, 339 are illustrated as a single member.

A frame-side power supplying coil 340 is attached to an inner surface of the holder member 336, and is connected to the power source 306 via a conducting wire 342. A ring-like frame-side communication coil 344 is attached to a lower surface of the support plate 339, around the center line of the cylindrical cam 10, and the two-way serial high-speed communication device 326 is connected to the coil 344 via a signal cable 346.

A first holder member 350 is fixed to a closure plate 348 which is fixed to a lower surface of the index rotor 22 and closes a lower opening of the same 22, such that the holder member 350 is coaxial with the index rotor 22. The holder member 350 includes a large-diameter attachment portion 351, and an axis portion 352 projecting from the attachment portion 351. The attachment portion 351 is fixed to the closure plate 348, and the axis portion 352 is supported by the first holder member 336 via a pair of bearings 353 such that the second holder member 350 is rotatable about the center line of rotation of the index rotor 22.

A rotor-side power-receiving coil 354 is attached to the axis portion 352 of the second holder member 350, such that the power-receiving coil 354 is opposed to the power-supplying coil 340 with a small spacing provided therebetween. The electric energy transmitted from the power-supplying coil 340 to the power-receiving coil 354 is supplied to the actuators 86, 88, 186, 260 of each of the twenty EC mounting units 24 via a conducting wire 356 connected to the power-receiving coil 354.

A ring-like rotor-side communication coil 358 is attached to the attachment portion 351 of the second holder member 350, around the center line of the cylindrical index rotor 22, and is opposed to the frame-side communication coil 344 with a small spacing provided therebetween. The rotor-side communication coil 358 is connected via a signal cable 359 to the communication sections $ZS_1$ to $ZS_{20}$, $\theta S_1$ to $\theta S_{20}$, $NS_1$ to $NS_{20}$, and $VS_1$ to $VS_{20}$ of the actuator control devices 300, 301, 302, 304.

The previously-described rotary joint 172 is fixed to the closure plate 348, and the previously-described axis member 178 extends through the second holder member 350 such that the axis member 178 is fit in the rotary joint 172 and is rotatable relative to the same 172.

Figure 10:
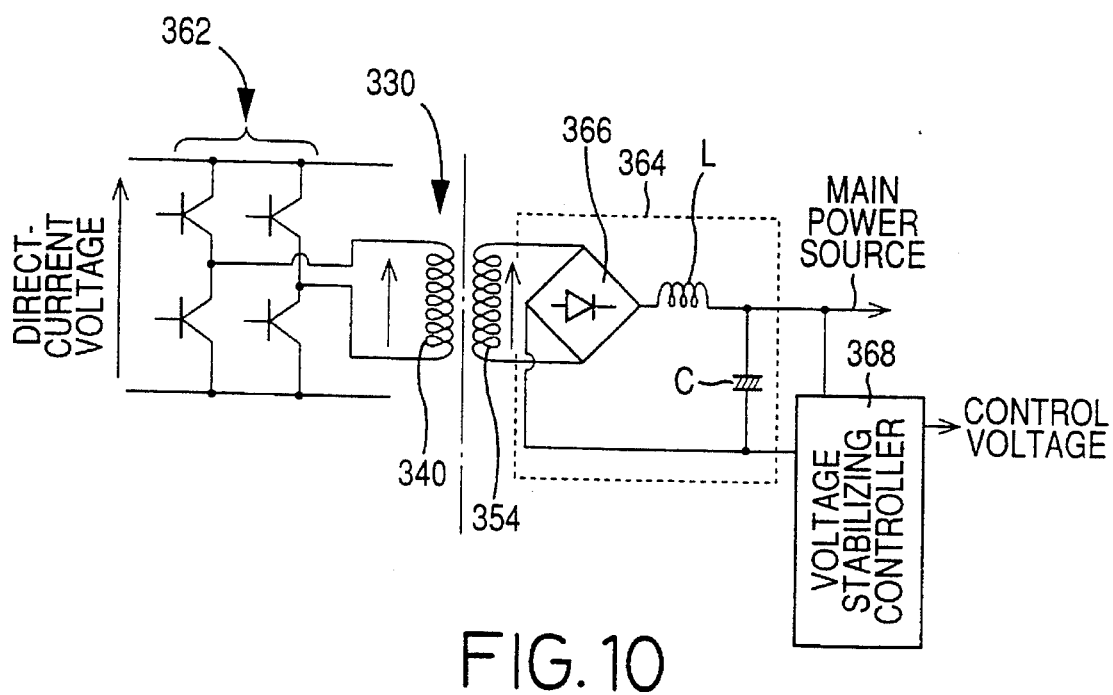
FIG. 10 is a diagrammatic view of a high frequency induction power generation controller and a rectifying circuit employed in the control circuit of FIG. 10.

The frame-side power supplying coil 340 of the electric-power supply 332 is energized at high frequency. As shown in FIGS. 9 and 10, the direct-current voltage of the power source 306 is converted into a high frequency alternate current voltage by a transistor switch 362 which provides the high frequency induction power generation controller 328. Consequently a rectangular-wave voltage (or a sine-curve voltage) corresponding to the ratio of the number of turns in the primary coil, i.e., frame-side power supplying coil 340 of the electric-power supply 332 to that of the secondary coil, i.e., rotor-side power-receiving coil 354 of the electric-power receiver 334, is produced in the secondary coil 354. This voltage is full-rectified by a rectifying circuit 366 which is provided on the index rotor 22 and is constituted by a high frequency diode bridge 366 and an LC filter including a reactor, L, and a smoothing capacitor, C. The thus-obtained direct current is utilized as a main direct current which drives the various actuators 86, 88, 186, 260 mounted on the index rotor 22. A voltage stabilizing converter 368 that is a regulator for stabilizing part of the above-described main direct current, is provided on the index rotor 22. The rectifying circuit 364 and the voltage stabilizing converter 368 cooperate with each other to provide a voltage control device 331 shown in FIG. 8.

Each solenoid-operated direction-switching valve 186 is controlled by a simple circuit including a switch (not shown) which is provided on the index rotor 22 and which may be of a no-contact type or a contact type. When this switch is closed according to an ON (energization) signal which is produced by the actuator control circuit 312 based on an energization command from the main controller 310 and then is supplied from the side of the frame member 8 to the side of the index rotor 22 via the no-connection information transmitting device 316, the switching valve 186 is energized. However, the more complicate circuit as shown in FIG. 9 is employed for controlling each of the other actuators, i.e., Z servo motors 86, θ servo motors 88, and nozzle-selecting servo motors 260.

Out of the four sorts of drive/control sections ZC, θC, NC, VC, eighty in total, the sixty servo-motor drive/control sections ZC, θC, NC each include a power switch 380, a current amplifier 382, and a current-supply command generator 384 as shown in FIG. 9.

FIG. 9 shows the control circuit for controlling each Z servo motor 86. The current-supply command generator 384 generates a current-supply command signal based on a torque command signal transmitted by the no-connection information transmitting device 316 and a phase signal which is produced by the Z-position detector 118 and represents an angular position of a magnetic pole of the Z servo motor 86. The current-supply command signal is supplied to the current amplifier 382. A feedback (i.e., detection signal) of the electric current supplied to the Z servo motor 86 is also input to the current amplifier 382, which amplifies the current-supply command signal based on the difference of the command signal and the detection signal, and produces the current-supply command signal in the form of a PWM wave (pulse width modulation wave) based on comparison with a chopping wave. The thus produced command signal is supplied to the power switch 380.

The power switch 380 may be provided by a power transistor, MOSFET (metal oxide semiconductor field-effect transistor), IGBT (insulated gate bipolar transistor), etc. The output signal of the current amplifier 382 is input to an amplifier (not shown) which supplies a drive signal to the base (or gate) of the power switch 380. The current amplifier 382 receives a control voltage controlled and stabilized by the voltage stabilizing converter 368. The power switch 380 modulates the main direct current supplied from the rectifying circuit 364, according to the drive signal as the output signal of the current amplifier 382, and supplies, to the Z servo motor 86, the PWM voltage which ensures that the feedback signal coincides with the torque command signal.

In the foregoing description, the communication control section 314 provided on the side of the frame member 8, and the communication sections ZS, θS, NS of the servo-motor control devices 300, 301, 302 provided on the side of the index rotor 22, are not described for the purpose of easier understanding only. Hereinafter, those elements 314, ZS, θS, NS will be described.

In the two-way serial high-speed communication device 326 of the communication control section 314, a high frequency carrier wave is modulated based on an analog signal to be transmitted. This modulation may be a width modulation, frequency modulation, or phase modulation. In the case where the carrier wave consists of a series of periodic pulses, the pulse amplitude, pulse width, or pulse frequency of the carrier wave may be changed based on the analog signal. In the communication section ZS, θS, NS, the modulated carrier wave is demodulated.

It is required that the sixty torque command signals as the command signals supplied from the actuator control device 312 be transmitted from the side of the frame member 8 and be received by the three sorts of actuators 86, 88, 260, sixty in total, mounted on the index rotor 22, separately from one another and separately from the sixty feedback signals that are transmitted from the side of the index rotor 22 and received on the side of the frame member 8. Similarly, it is required that the twenty energization command signals supplied from the actuator control device 312 be transmitted from the side of the frame member 8 and be received by the solenoid-operated direction-switching valves 186 mounted on the index rotor 22, separately from one another. However, the no-connection information transmitting device 316 is commonly used for transmitting the sixty torque command signals and the twenty energization command signals. To this end, the two-way serial high-speed communication device 326 of the communication control section 314 is utilized. The communication control section 314 transmits, before transmission of a torque or energization command signal, an address signal indicative of which section the command signal is directed to out of the eighty communication sections, $ZS_1$ to $ZS_{20}$, $\theta S_1$ to $\theta S_{20}$, $NS_1$ to $NS_{20}$, $VS_1$ to $VS_{20}$, of the actuators 86, 88, 186, 260 provided on the index rotor 22 (hereinafter, referred to simply as the "eighty sections ZS, θS, NS, VS"). Each of the eighty sections ZS, θS, NS, VS receives only the command signals each having the address signal indicative of itself. If each of the eighty sections ZS, θS, NS, VS receives the address signal indicative of itself, then that section sends back an OK signal indicating that the section can receive a command signal. Responsive to the OK signal, the communication control section 314 transmits a torque or energization command signal so that the above section receives the command signal.

Similarly, in the case where each of the sixty communication sections ZS, θS, NS transmits a feedback signal to the communication control section 314, a high frequency carrier wave is modulated based on the feedback signal to be transmitted. The modulated carrier wave is demodulated by the two-way serial high-speed communication device 326. When a feedback signal is transmitted, first, a call signal is transmitted to the communication control section 314. If the control section 314 sends back an OK signal in response to the call signal, the feedback signal is transmitted after an address signal indicative of which one of the sixty sections ZS, θS, NS transmits the feedback signal has been added to the head of the feedback signal. Thus, the control section 314 can receive the respective feedback signals of the sixty sections ZS, θS, NS separately from one another.

In the present embodiment, the communication sections $VS_1$ to $VS_{20}$ of the twenty solenoid valves 186 transmit respective feedback signals each indicative of the completion of direction switching. However, this is not essentially required. In the sections VS, too, a high frequency carrier wave is modulated based on a feedback signal to be transmitted, and the modulated carrier wave is demodulated by the two-way serial high-speed communication device 326.

The voltage control device 331 includes a communication section, $S_{331}$. A number of actuators 86, 88, 260, 186 are provided on the index rotor 22, and some of those actuators may be operated concurrently. Hence, the voltage of the power receiving coil 354 is detected, and a feedback signal indicative of the detected voltage is transmitted to the high frequency induction power generation controller 328 via the no-connection information transmitting device 316. In the communication section $S_{331}$, too, a high frequency carrier wave is modulated based on a feedback signal, and the modulated carrier wave is demodulated by the two-way serial high-speed communication device 326.

In the present EC mounting apparatus 6, the index rotor 22 is intermittently rotated so that the respective EC mounting heads 80 of the twenty EC mounting units 24 are sequentially moved to the EC supplying station A where each head 80 holds an EC 238 by vacuum suction, and then moved to the EC mounting station D where each head 80 mounts the EC 238 on a PCB 30.

On each of the twenty EC mounting heads 80, an appropriate one of the six EC suction nozzles 220 is selected, and the elevation level and angular position of the selected nozzle 220 are controlled. To this end, the position information produced from the Z-position detector 118, θ-position detector 136, and nozzle-selection detector 280 is supplied to the main controller 310 provided on the frame member 8.

However, it is generally difficult to assemble a servo motor with a position detector which detects an angular position of the servo motor, such that the position of origin of the servo motor accurately coincides with that of the position detector. Therefore, it cannot be said that the output values of the detectors 118, 136, 280 accurately represent the elevation level and angular position of each EC suction nozzle 220 or the angular position of each EC mounting head 80 (or nozzle holder 218) around a horizontal axis line (or axis member 226).

Which one of the six EC suction nozzles 220 is currently selected on each EC mounting head 80 is identified by the previously-described EC suction nozzle identifying device (not shown). Each of the twenty nozzle-selecting servo motors 260 is so controlled as to rotate a corresponding nozzle holder 218 by an angle corresponding to the difference between the angular position of the current nozzle 220 and that of a nozzle 220 to be selected next. Therefore, each nozzle-selection detector 280 is free from the problem that the position of origin of the nozzle-selecting servo motor 260 may not accurately coincide with that of the detector 280.

No device is employed which detects the absolute elevation level or absolute angular position of each EC suction nozzle 220. Therefore, the elevation level and angular position of each nozzle 220 must be controlled based on only the detection results of the Z-position detector 118 and the θ-position detector 136. Thus, each nozzle 220 may suffer from the errors or deviations of the respective origins of the detectors 118, 136 from the elevation-level and angular-position origins of the nozzle 220.

However, as far as the θ-position detectors 136 are concerned, small assembling errors are tolerable. For example, the current EC suction nozzle 220 of each EC mounting head 80 is identified by the EC suction nozzle identifying device, after the EC mounting head 80 is rotated about a vertical axis line thereof and positioned at the angular-position origin thereof, i.e., after the current EC suction nozzle 220 is positioned at the angular-position origin. However, the degree of required accuracy of this positioning is not so high. Moreover, an image of the EC 238 held by the EC suction nozzle 220 is taken by an image pick-up device (not shown), so that the deviation of the actual angular position of the EC 238 from a reference angular position thereof is corrected simultaneously when the deviation of the actual position of the center of the component 238 from a nominal center position thereof is corrected. Regarding the accuracy of EC mounting, each EC suction nozzle 220 does not suffer from the problem that the position of origin of the θ-position detector 136 may be deviated from the angular-position origin of the nozzle 220.

Hence, in the present embodiment, countermeasures are provided against only the assembling errors that are produced when the Z-position detectors 118 are assembled with the Z servo motors 86.

After the assembling of the present EC mounting apparatus 6 has been finished, a nozzle imitation is attached, in place of an EC suction nozzle 220, to each of the twenty EC mounting heads 80. Each EC mounting head 80 positioned at the EC supplying position is lowered down to a position where a suction pipe 234 of the imitation nozzle contacts, and is stopped at, a reference plane. In this state, a detection value indicated by the Z-position detector 118 is read as a deviation, A, of the origin of the Z-position detector 118 from the Z-position origin of the EC mounting head 80, and the deviation value A is stored in a non-volatile memory (ROM, back-up RAM, external memory device, etc.) of the main controller 310.

The above nozzle imitation has a shape similar to that of the EC suction nozzles 220. The nozzle imitation has a flange adapted to contact an end surface of the EC mounting head 80, and a screw for fixing the nozzle imitation to the mounting head 80 with the flange contacting the head 80.

The nozzle imitation is fixed to the head 80 such that the imitation is immovable relative to the head 80 in an axial direction of the imitation.

The above-mentioned reference plane is defined by an EC-carrier-tape support surface of one of a plurality of EC supplying cartridges attached to a movable table which one cartridge is located at one of opposite ends of the table in the direction of movement of the table. An EC carrier tape is supported and fed on the EC-carrier-tape support surface of the EC supplying cartridge. The differences of the respective elevation levels of the EC-carrier-tape support surfaces of the EC supplying cartridges and the differences of the respective lengths of the EC suction nozzles 220 may be very small and negligible. However, in the case where one or both of the above-indicated first and second differences are large and not negligible, it is required that the first or second differences be measured and stored in a memory (e.g., RAM) of the main controller 310.

The deviation value A stored in the main controller 310 is utilized as follows:

In the following explanation, it is assumed for easier understanding only that the EC suction nozzles 220 are not moved up or down relative to the cylindrical cam 10. Since the focal position of the image pick-up device and the position of a PCB support surface which is described below are pre-determined by taking into consideration the vertical movements of each nozzle 220 relative to the cam 10, the vertical movements of each nozzle 220 relative to the cam 10 do not influence the control of the Z servo motor 86 to vertically move the nozzle 220. It can thus be said that the above assumption is reasonable. For example, the EC mounting station D is provided at an elevation level lower than that of the EC supplying station A, and accordingly the above-described reference plane is provided at an elevation level different from that of the PCB support surface. However, this elevation-level difference is accommodated by the vertical movements of each EC mounting unit 24 through the cam groove 76. Thus, it can be assumed that the PCB support surface and the reference plane are provided at the same elevation level.

When each EC mounting head 80 holds an EC 238 by vacuum suction, the suction pipe 234 of the head 80 is additionally lowered by a small distance from an elevation level where the suction pipe 234 is designed to contact the EC 238. This operation is done for the suction head 80 to securely hold the EC 238 even if the EC 238 or an EC carrier tape has production-related errors. The lowering of the suction pipe 234 is permitted because the biasing spring 240 is compressed and the suction-pipe holder 232 and the nozzle holder 218 are moved relative to each other. However, it is preferred that the distance of lowering of the suction pipe 234 be as small as possible so as not to lower the efficiency of EC mounting. For example, in the case where the speed of lowering of the mounting head 80 is reduced in the vicinity of the EC 238 so as to prevent the EC 238 from being broken because of the impact of collision of the suction pipe 234 with the EC 238, a large distance of the above additional lowering of the suction pipe 234 leads to excessively lowering the EC-mounting efficiency.

In the present embodiment, when an EC 238 is held by vacuum suction, each EC mounting head 80 is lowered down to a position, (A+T'+C'−B'), where A is the deviation value stored in the main controller 310; T' is a value corresponding to a thickness, T, of the EC carrier tape; C' is a value corresponding to a thickness, C, of the EC 238; and B' is a value corresponding to a distance, B, of relative movement of the nozzle holder 218 and suction-pipe holder 232. The position (A+T'+C'−B') is detected as an output value of the Z-position detector 118. The EC mounting head 80 is lowered at a reduced speed over a predetermined distance near the lowest position thereof. The main controller 310 supplies, to the actuator control circuit 312, the command signals which cause the above operations.

After the EC mounting head 80 holds the electronic component 238 by vacuum suction, the head 80 is moved up by a distance, L, to the highest position thereof. This is done for preventing the suction pipe 234 or the EC 238 from colliding with members or elements disposed around the cam 10 and rotor 22. From this point of view, it is preferred that the rotation of the index rotor 22 be started after the head 80 reaches the highest position thereof. In the present embodiment, however, the rotor 22 starts rotating before the head 80 reaches the highest position, for the purpose of improving the EC-mounting efficiency. As the rotor 22 is rotated, the head 80 is rotated or moved to the EC-holding-error detecting station C where an image of the EC 238 held by the head 80 is taken by the image pick-up device. Additionally, for the same purpose, the head 80 is controlled to start a downward movement thereof before the rotor 22 finishes an intermittent rotation thereof, when the EC suction nozzle 220 holds the EC 238 by vacuum suction.

At the EC-holding-error detecting station C, each EC mounting head 80 is moved down by, e.g., a distance, L/2, to a position where a bottom surface of the EC 238 held by the EC suction nozzle 220 coincides with the focus of a CCD (charge-coupled device) camera of the image pick-up device. To this end, the Z servo motor 86 is rotated until the output value of the Z-position detector 118 becomes equal to a value, {A+(L/2)'+C'}, where (L/2)' is a value corresponding to the distance L/2. The main controller 310 supplies the value {A+(L/2)'+C'} to the Z-servo-motor control device 300. After the image taking, the head 80 is moved up to the highest position thereof spaced by the distance L from the reference plane. The upward and downward movements of the head 80 are carried out concurrently with the intermittent rotations of the index rotor 22.

At the EC mounting station D, each EC mounting head 80 is moved downward so as to mount the EC 238 on the PCB 30. For the EC mounting, the head 80 is lowered to a position where the output signal of the Z-position detector 118 indicates a value, (A+P'+C'−B'), where P' is a value corresponding to a thickness, P, of the PCB 30. The main controller 310 supplies the command value (A+P'+C'−B') to the Z-servo-motor control device 300. After the EC mounting, the head 80 is moved up to the highest position thereof. Like at the time of EC holding, the head 80 starts the downward movement before the index rotor 22 ends the intermittent rotation to move the head 80 to the station D, and the rotor 22 starts the next intermittent rotation to move the head 80 to another station before the head 80 reaches the highest position thereof.

Each of the above-described command values supplied by the main controller 310 includes the error value A, and the error value A is determined and stored for each of the twenty EC mounting units 24. Therefore, the EC suction nozzles 220 of all the EC mounting units 24 can be moved up and down to the predetermined positions with accuracy, without being influenced by the errors of assembling of the Z-position detector 118 and the Z servo motor 86.

Although each of the twenty EC mounting heads 80 has the six EC suction nozzles 220, the respective end faces of the suction pipes 234 of the six nozzles 220 are positioned on a circle whose center rides on the rotation axis line of the nozzle holder 218. Therefore, the six nozzles 220 of each head 80 can be operated with a common error value A.

Hereinafter, there will be described the operation of the EC mounting apparatus 6 constructed as described above.

For EC mounting, the index rotor 22 is intermittently rotated, so that the respective EC mounting heads 80 of the twenty EC mounting units 24 sequentially hold EC 238 by vacuum suction and mounts the EC 238 on a PCB 30.

For EC holding, each EC mounting head 80 is moved downward by the Z.θ drive motor 84 until the output signal of the Z-position detector 118 indicates a value equal to a command value produced by the main controller 310. Consequently the suction pipe 234 of the EC suction nozzle 220 contacts the EC 238.

After the suction pipe 234 contacts the EC 238, the solenoid valve 186 is switched to apply vacuum to the EC suction nozzle 220, so that the suction pipe 234 holds the EC 238 by vacuum suction. After the EC holding, the EC mounting head 80 is moved upward and simultaneously moved to the EC-upright-posture detecting station B where whether the EC 238 held by the EC suction nozzle 220 is taking an upright posture (i.e., lying on its side edge) is identified.

In the case where the EC 238 is mounted on the PCB 30 after having been rotated following the holding thereof by the EC suction nozzle 220, the EC mounting head 80 is rotated by the θ servo motor 88 during a time duration when the EC mounting unit 24 is moved from the EC-upright-posture detecting station B to the EC-holding-error detecting station C. Thus, the component 238 takes a posture suitable for being mounted on the PCB 30.

At the EC-holding-error detecting station C, an image of the EC 238 held by the EC suction nozzle 220 is taken by the image pick-up device. The EC mounting head 80 is moved downward to a position where the Z-position detector 118 outputs a detection value equal to a command value produced by the main controller 310, during the time duration when the EC mounting unit 24 is moved from the EC-upright-posture detecting station B to the EC-holding-error detecting station C. Thus, irrespective of whatever dimensions the EC 238 may have, the image of the EC 238 is taken under the condition that the bottom surface of the EC 238 is positioned at the focus of the CCD camera of the image pick-up device. Thus, an excellent image is taken.

While the EC mounting unit 24 is moved to the EC mounting station D after the image taking, the EC mounting head 80 is moved upward and simultaneously is rotated by the θ servo motor 88 to correct an angular error, $\delta\theta_E$, of the EC 238 and an angular error, $\delta\theta_p$, of the PCB 30. In addition, a center-position error, δX and δY, of the PCB 30 from a nominal center position thereof is corrected by the PCB moving device 32. At the EC mounting station D, the EC mounting head 80 is moved downward by the Z servo motor 86 until the Z-position detector 118 outputs a detection value equal to the command value (A+P'+C'−B') produced by the main controller 310. Thus, the EC 238 is mounted on the PCB 30.

After the EC mounting, the EC mounting head 80 is moved upward, and is rotated to an angular-position origin thereof by the θ servo motor 88 during a time duration when the EC mounting unit 24 is moved to the EC discarding station E. The amount of rotation of the head 80 back to the angular-position origin thereof is equal to the sum of the angular error $\delta\theta_E$ of the EC 238 and the angular error $\delta\theta_p$ of the PCB 30 which have been corrected. In the case where the head 80 is rotated after holding the EC 238 in order that the EC 238 may take a posture suitable for being mounted on the PCB 30, the head 80 is additionally rotated backward by an amount corresponding to that rotation, so that the head 80 is returned to the angular-position origin.

If the upright posture of the EC 238 held by the EC suction nozzle 220 has been identified at the EC-upright-posture detecting station B, the EC 238 is discarded at the EC discarding station E.

Next, at the EC-suction-nozzle identifying station F, the specific sort of the EC suction nozzle 220 positioned at the EC suction position is identified. The result of this identification is supplied to the main controller 310, which in turn produces, based on this information, command information to drive the nozzle-selecting servo motor 260 and supplies the information to the actuator control circuit 312. In the case where the currently used EC suction nozzle 220 is changed with another nozzle 220 to hold a different sort of EC 238 at the EC supplying station A, the above command information includes information indicative of a required amount of rotation of the nozzle holder 218 that will be detected by the nozzle-selection detector 280. During a time duration when the EC mounting unit 24 is moved to the EC-suction-nozzle correcting station G, the nozzle holder 218 is rotated by the nozzle-selecting servo motor 260, and a newly selected one of the six EC suction nozzles 220 is positioned at the EC suction position.

At the EC-suction-nozzle correcting station G, first, the sort of the EC suction nozzle 220 positioned at the EC suction position is identified, and the actuator control device 312 judges whether the identified sort of the nozzle 220 is identical with a required sort of nozzle 220 to be used to hold an EC 238. If a negative judgment is made, the control circuit 312 supplies, to the nozzle-selecting-servo-motor control device 302, a command value indicative of a needed amount of rotation of the nozzle holder 218, so as to drive the nozzle-selecting servo motor 260 to rotate the holder 218 and thereby position the selected nozzle 220 at the EC suction position. The needed amount of rotation of the holder 218 is detected by the nozzle-selection detector 280.

As is apparent from the foregoing description, in the present embodiment, each of the twenty EC mounting heads 80 is associated with the Z.θ drive motor 84 (86, 88) for rotating the head 80 about a vertical axis line and moving the same 80 along the axis line, and each of the twenty Z.θ drive motors 84 is provided on the index rotor 22. In addition, the twenty nozzle-selecting servo motors 260 and the twenty solenoid-operated direction-switching valves 186 are also provided on the index rotor 22. Since those actuators 84, 260, 186 can be operated, as needed, even when the index rotor 22 is being rotated, the EC-mounting efficiency is easily improved.

Moreover, the electric energy and the control information are supplied and transmitted to the actuators 84, 260, 186, or the actuator control devices 300, 301, 302, 304, without needing any connection between the side of the cylindrical cam 10 and the side of the index rotor 22. Therefore, the present EC mounting apparatus 6 enjoys an improved durability and an extended life expectancy.

In the present embodiment, the electric energy is supplied to the twenty EC mounting units 24 via the common, single no-connection electricity supplying device 330. Thus, the production cost of the apparatus 6 is reduced as such. Although each one of the eighty actuators 86, 88, 260, 186 must receive specific control/command information directed thereto, independently of the other actuators, this is done by using the common, single no-connection information transmitting device 316. Accordingly, the production cost of the apparatus 6 is further reduced.

For example, if the present apparatus 6 are adapted such that the EC mounting units 24 are supplied with electric energy via respective separate electric wires, the main controller 310 provided on the side of the frame member 8 can control the electric energy supplied to each of the EC mounting units 24 via a corresponding one of the separate electric wires, thereby operating the actuators of each mounting unit 24. In the latter case, however, the same number of electric wires as that of the mounting units 24 are needed. Thus, as the number of the mounting units 24 increases, the complexity of construction of the apparatus 6 increases. The present apparatus 6 is free from this problem.

Moreover, if the present apparatus 6 are adapted such that the actuators 86, 88, 260, 186 are supplied with command information from, and supply operation information to, the main controller 310 via respective exclusive no-connection information transmitting devices 316 and respective separate information transmitting cables, the same number of devices 316 and cables as that of the actuators are needed. The present apparatus 6 is also free from the second problem.

As is apparent from the foregoing description, in the present embodiment, the index rotor 22 provides a rotary member as a sort of movable member; the driven gear 12, index servo motor 16, and drive gear 18 cooperate with one another to provide a moving device for moving the movable member; the θ servo motor 88 as a sort of head-rotating electric motor provides a rotating device for rotating an EC mounting head; the Z servo motor 86 as a sort of head-moving electric motor provides an advancing and retracting device for advancing and retracting the EC mounting head; the solenoid valve 186 provides a vacuum-supply control device; the nozzle-selecting servo motor 260 provides an EC-suction-nozzle-selecting device; and the control/drive sections ZC, θC, NC, VC provide an actuator control device.

In addition, the ball screw 100 provides an externally threaded screw; the permanent magnets 102, 103 provides rotors; the spline member 120 provides a rotary member; and the spline axis 126 provides an axis member.

Figure 13:
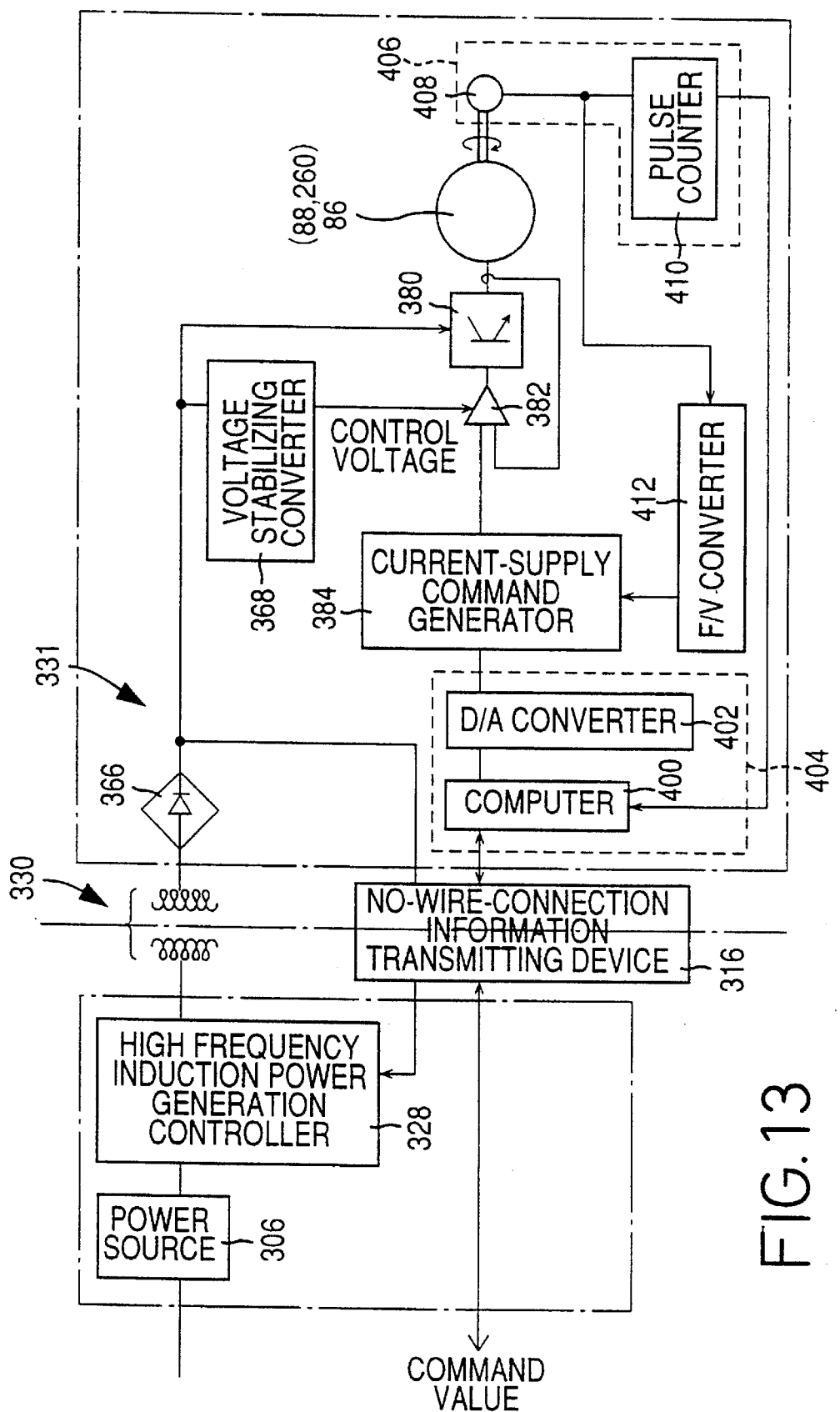
FIG. 13 is a diagrammatic view corresponding to FIG. 9, showing a control circuit for controlling a servo motor employed in another EC mounting apparatus as a second embodiment of the present invention.

Referring next to FIG. 13, there is illustrated a different control circuit employed in a second embodiment of the present invention, for controlling each of the Z servo motors 86, θ servo motors 88, and nozzle-selecting servo motors 260 which are provided on the index rotor 22. The following description relates to a control circuit for a Z servo motor 86 as a representative of all the actuators 86, 88, 260.

The main controller 310 provided on the side of the frame member 8 supplies, to the side of the index rotor 22 via the no-connection information transmitting device 316, (a) a target-position signal indicative of a target angular position of the Z servo motor 86 and (b) a rotation-speed signal indicative of a steady-state rotation speed of the same 86. The main controller 310 receives, from the side of the index rotor 22 via the no-connection information transmitting device 316, (c) operation-end information indicating that the Z servo motor 86 has been rotated to the target angular position (strictly, to within a certain range of tolerable errors around the target position) and (d) abnormality-detection information indicating that an abnormal operation of the Z servo motor 86 has been detected.

In the second embodiment, an intelligent control section 404 including a computer 400 and a D/A (digital to analog) converter 402 is provided on the index rotor 22. The computer 400 determines, based on the target-position command value and rotation-speed command value supplied via the information transmitting device 316, a motor-speed control pattern including the acceleration of rotation of the Z servo motor 86 at the time of starting, the steady-state rotation of the same 86, and the deceleration of rotation of the same 86 at the time of stopping. The computer 400 is supplied with a digital value from an electronic multi-rotation absolute encoder 406 as a sort of pulse generator. The encoder 406 corresponds to the Z-position detector 118 employed in the first embodiment. The computer 400 determines instantaneous torque command values based on the predetermined motor-speed control pattern and the digital values indicative of the angular positions of the Z servo motor 86.

The absolute encoder 406 includes an incremental encoder 408 and a pulse counter 410. As the Z servo motor 86 rotates, the incremental encoder 408 generates pulse signals each of which is indicative of a phase different by 90 degrees from a corresponding actual phase of the motor 86, and generates a single origin signal whenever the motor 86 passes through the position of origin thereof. The pulse counter 410 counts the number of the pulse signals and the number of the origin signals. When the motor 86 rotates in a forward direction, the counter 410 increases the counted numbers and, when the motor 86 rotates in a backward direction, the counter 410 decreases the counted numbers. The absolute encoder 406 is supplied with electricity from a battery (not shown). Therefore, even when the present apparatus 6 is disconnected from the power source 306, the absolute encoder 406 may operate so that the output of the pulse counter 410 indicates an absolute angular position of the Z servo motor 86.

A torque command value produced from the computer 400 is converted by the D/A converter 402 into a torque command signal in the form of an analog signal, which is supplied to the current-supply command generator 384. The command generator 384 is connected to an F/V (frequency to voltage) converter 412 which converts the frequency of pulse signals supplied from the incremental encoder 408, into a voltage whose magnitude is proportional to the rotation speed of the Z servo motor 86. The current-supply command generator 384 generates a current-supply command based on the torque command signal from the D/A converter 402 and the voltage from the F/V converter 412. The control operations subsequent to the above operations are the same as those described above for the first embodiment, and accordingly the description thereof is omitted.

In the first embodiment shown in FIGS. 1 to 12, the main controller 310 provided on the side of the frame member 8 has the function of determining a motor-speed control pattern for each of the servo motors 86, 88, 260, and determines, based on the predetermined control pattern, instantaneous command signals corresponding to target angular positions that change as time elapses. The thus determined command signals are supplied to the position amplifier 320. In contrast, in the second embodiment, the computer 400 of the intelligent control section 404 has the function of determining a motor-speed control pattern for each of the servo motors 86, 88, 260. Accordingly, the information supplied from the side of the frame member 8 to the side of the index rotor 22 via the no-connection information transmitting device 316, contains only the information indicative of the final target angular position of the Z servo motor 86 and the information indicative of the steady-state rotation speed of the same 86. The information supplied from the side of the index rotor 22 to the side of the frame member 8 contains only the operation-end information and the abnormality-detection information. In the second embodiment, therefore, the frequency of transmission of the information is reduced, and the main controller 310 can use increased time for carrying out other operations than the information transmission.

In the second embodiment, the error of assembling of the absolute encoder 406 relative to the Z servo motor 86 is measured after the overall assembling of the present apparatus 6 is finished. The measured error value, A, is supplied to the main controller 310 on the side of the frame member 8, via the no-connection information transmitting device 316.

In the second embodiment, the communication between the communication control section 314 and each of the eighty communication sections ZS, θS, NS, VS is carried out as follows:

The main controller 310 periodically carries out an information transmitting operation at a regular interval of time. Each information transmitting operation is finished in a time duration (hereinafter, referred to as a "permitted communication time") sufficiently shorter than the above regular interval. Thus, the communication for transmitting information between the communication control section 314 and each of the communication sections ZS, θS, NS, VS is carried out within the permitted communication time.

In the case where the main controller 310 has information to be transmitted, the main controller 310 transmits the information via the communication control section 314 and, then, each of the communication sections ZS, θS, NS, VS supplies the operation-end and/or abnormality-detection information to the main controller 310. Thus, strictly, in the present embodiment, the apparatus 6 employs a "semi"-two-way communication method.

Based on an address code added to the head of information supplied to the communication control section 314, first, the control section 314 sends an address signal indicative of one of the eighty communication sections ZS, θS, NS, VS to which the information is to be transmitted. When that one communication section is ready to receive the information, the communication section sends back an OK signal to the communication control section 314. In response thereto, the control section 314 supplies information indicative of a target angular position of the corresponding servo motor 86, 88, 260, 186 and information indicative of a steady-state rotation speed of the same, and additionally supplies information relating to error checking. More specifically described, the main controller 310 supplies, to the communication control section 314, data indicative of the target angular position and data indicative of the steady-state rotation speed, and additional data relating to error checking (e.g., cyclic code obtained by treating data in a data block using a specific binary polynomial). Thus, a redundancy check (e.g., cyclic redundancy check, CRC) is carried out.

Therefore, the above communication section ZS, θS, NS, VS carries out the redundancy check after receiving the motor control information from the communication control section 314, and sends back, to the control section 314, information indicating that the communication section has received the information appropriately or inappropriately.

One or more of the eighty communication sections ZS, θS, NS, VS which corresponds or correspond to a servo motor or motors 86, 88, 260, 186 which has or have finished an operation, or suffered an operational abnormality, after the preceding permitted communication period has elapsed, transmits a call signal to call the communication control section 314, after the communication caused by the control section 314 has finished. In response thereto, the control section 314 sends back an OK signal to that or those communication sections ZS, θS, NS, VS, which then transmits or transmit operation-end and/or abnormality-detection information together with an identity signal indicative of the information transmitting device, i.e., control section 314.

Signals coded by, e.g., ASCII (American National Standard Code for Information Interchange) are used for all the communications between the communication control section 314 and each of the communication sections ZS, θS, NS, VS via the no-connection information transmitting device 316. Parallel coded signals are converted into serial coded signals by a parallel-to-serial converter, and the serial coded signals are amplitude-modulated or frequency-modulated and then are transmitted in a wireless manner by the no-connection information transmitting device 316. Thereafter, the received serial coded signals are demodulated and then converted into parallel coded signals again.

In the second embodiment, the communication control section 314 supplies information indicative of a final target angular position and a steady-state rotation speed for each servo motor 86, 88, 260, 186. Based on that information, the intelligent control section 404 provided on the index rotor 22 determines a motor-speed control pattern and controls each servo motor based on the determined control pattern. However, it is possible to modify the present embodiment such that a motor-speed control pattern is determined on the side of the frame member 8 and the control section 314 supplies command values indicative of instantaneous target angular positions of each servo motor based on the pre-determined control pattern. The instantaneous target angular positions correspond to very short intervals of time, respectively. In the latter case, it is preferred that the intelligent control section 404 provided on the index rotor 22 be replaced by a smoothing device which produces a signal indicative of a smoothed target angular position obtained by smoothing instantaneous target angular positions that gradually change at very short intervals. Otherwise, the intelligent control section 404 may be omitted without employing anything in place of the same 404. In the latter case, the output values of the electronic multi-rotation absolute encoder 406 are supplied from the side of the index rotor 22 to the side of the frame member 8 via the no-connection information transmitting device 316.

In the second embodiment, when each of the communication sections ZS, θS, NS, VS has information to be transmitted to the communication control section 314, that communication section calls the control section 314. However, it is possible to modify the second embodiment such that each time the control section 314 supplies information to each communication section ZS, θS, NS, VS, that communication section supplies, to the control section 314, information which may include (a) information indicating that a corresponding servo motor 86, 88, 260, 186 has rotated to a commanded target angular position and/or (b) information indicating that an abnormality has occurred during the rotation up to the target angular position, after the transmission of information from the control section 314 to that communication section has finished. In the latter case, each communication section ZS, θS, NS, VS need not have the function of calling the control section 314, thereby contributing to simplifying the communication system. The latter manner of communication is not suitable for (i) the illustrated second embodiment wherein the communication control section 314 supplies a final target angular position and a steady-state rotation speed for each servo motor, and suitable for (ii) the modified form wherein the control section 314 supplies instantaneous target angular positions of each servo motor. In the first case (i), since the frequency of supplying of information from the control section 314 is low, it may take a longer time for each communication section ZS, θS, NS, VS to supply information to the control section 314 and accordingly the main controller 310 may receive delayed information indicative of operational conditions of each actuator 86, 88, 260, 186. In contrast thereto, in the second case (ii), the frequency of supplying of information from the control section 314 is very high.

While the present invention has been described in its preferred embodiments, it is to be understood that the present invention may otherwise be embodied.

For example, the radio-communication-type no-connection information transmitting device 316 employed in each of the first and second embodiments may be replaced by an optical-communication-type no-connection information transmitting device.

In each of the first and second embodiments, each of the EC mounting heads 80 is moved up and down by the cam 10, so as to accommodate the differences of the elevation levels of (a) the EC supplying position of an EC supplying cartridge, (b) the PCB support plane on which a PCB is supported, and (c) the position where the image pick-up device is disposed. However, the cam 10 may be omitted and the Z.θ drive motors 84 may be used to eliminate the above differences.

In addition, each Z.θ drive motor 84 may be replaced by a Z servo motor and a θ servo motor which are separate from each other.

In each of the illustrated embodiments, the respective free ends of the six EC suction nozzles 220 of each EC mounting head 80 are positioned on a circle whose center rides on the rotation axis line of the nozzle holder 218. However, this is not essentially required. For example, the respective free ends of the six EC suction nozzles 220 may be positioned on different circles each of which has a center on the rotation axis line of the nozzle holder 218. In the latter case, each time the EC suction nozzles 220 are changed, a command value indicative of the lowest position of each EC suction head 80 is updated, as needed.

In the case where an EC 238 is mounted on a PCB 30 after having been rotated by more than 90 degrees from the posture at the time of being held by a EC mounting head 80, it is possible to rotate the EC 238 by just 90 degrees during a time duration after the EC 238 is held and before an image of the EC 238 held by the head 80 is taken by the image pick-up device, and subsequently rotate the same 238 by the remaining angle simultaneously when the head 80 is rotated to correct the angular-position error $\delta\theta_E$ of the EC 238, during a time duration after the image taking and before the EC 238 is mounted on the PCB 30.

Although in each of the illustrated embodiments the index rotor 22 that is a rotary member rotatable about an axis line is employed as the movable member of the EC mounting apparatus in accordance with the present invention, it is possible to use, in place of the rotor 22, a linearly movable member that is movable along a straight line.

While in each of the illustrated embodiments the twenty EC mounting heads 80 are provided on the index rotor 22, the present invention is applicable to an EC mounting apparatus which has only a single EC mounting head including two or more actuators which operate on electric energy.

The Z.θ drive motor 84 may be used as an electric motor for rotating an object other than the EC mounting head 80 about an axis line thereof and moves the object along the axis line.

It is to be understood that the present invention may be embodied with other changes, improvements, and modifications that may occur to those skilled in the art without departing from the scope and spirit of the invention defined in the appended claims.

What is claimed is:

1. An electronic-component mounting apparatus, including a frame member, a movable member supported by said frame member such that said movable member is movable relative to the frame member, a moving device which moves said movable member relative to said frame member, a mounting head which is provided on said movable member and mounts an electronic component on an object such as a printed circuit board, and at least two devices selected from (a) at least one rotating device including a first actuator which rotates said mounting head about an axis line thereof, (b) at least one advancing and retracting device including a second actuator which advances and retracts said mounting head in opposite directions parallel to an axis line thereof, respectively, (c) at least one vacuum-supply control device including a third actuator which controls vacuum supply to a suction nozzle of said mounting head, and (d) at least one suction-nozzle selecting device including a fourth actuator which selects one of a plurality of suction nozzles of said mounting head, said at least two devices including at least two actuators selected from at least one said first actuator, at least one said second actuator, at least one said third actuator, and at least one said fourth actuator, wherein the improvement comprises:

said at least two actuators including at least two electric actuators which are provided on said movable member and are operable on electric energy;

a power source which is provided on said frame member and provides said electric energy;

a main control device which is provided on said frame member;

an actuator control device which is provided on said movable member and controls said electric actuators;

an electricity supplying device which includes a first supplying section provided on said frame member and a second supplying section provided on said movable member and which supplies said electric energy from said power source to said actuator control device, without having any wire connection between said first and second supplying sections; and an information transmitting device which includes a first transmitting section provided on said frame member and a second transmitting section provided on said movable member and which transmits, between said main control device and said actuator control device, information needed to control said electric actuators, without having any wire connection between said first and second transmitting sections.

2. An apparatus according to claim 1, wherein said movable member comprises a rotary member which is supported by said frame member such that said rotary member is rotatable about an axis line thereof, and wherein said moving device comprises a rotating device which rotates said rotary member about said axis line thereof relative to said frame member.

3. An apparatus according to claim 1, wherein said at least two devices comprises said rotating device and said advancing and retracting device, said rotating device comprising, as said first actuator, a first electric motor for rotating said mounting head about said axis line thereof, said advancing and retracting device comprising, as said second actuator, a second electric motor for advancing and retracting said mounting head along said axis line thereof.

4. An apparatus according to claim 3, wherein said second electric motor of said advancing and retracting device comprises:

a housing;

a nut which is provided in said housing such that said nut is rotatable about said axis line of said mounting head relative to the housing and is immovable relative to the housing in opposite directions parallel to said axis line;

an externally threaded screw member which is threadedly engaged with said nut such that said screw member is not rotatable about said axis line relative to said housing and is movable relative to the housing in said opposite directions parallel to said axis line;

a first rotor fixed to said nut; and a first electrically conductive coil which is provided in said housing, and wherein said first electric motor of said rotating device comprises:

a rotary member which is provided in said housing such that said rotary member is rotatable about said axis line relative to the housing and is immovable relative to the housing in said opposite directions parallel to said axis line;

an axis member which is supported by said rotary member such that said axis member is not rotatable about said axis line relative to said rotary member and is movable relative to the rotary member in said opposite directions parallel to said axis line, said mounting head being connected to said axis member;

a second rotor fixed to said rotary member;

a second electrically conductive coil which is provided in said housing; and a connecting device which connects said axis member of said first motor with said screw member of said second motor such that the axis member is rotatable about said axis line relative to the screw member and is immovable in said opposite directions parallel to said axis line.

5. An apparatus according to claim 1, wherein said at least two electric actuators comprise at least one electric drive source selected from the group consisting of an electric motor and a solenoid-operated valve.

6. An apparatus according to claim 1, wherein said at least two devices comprise two devices of different sorts selected from said rotating device, said advancing and retracting device, said vacuum-supply control device, and said suction-nozzle selecting device.

7. An apparatus according to claim 1, wherein said at least two devices comprise two devices of a same sort selected from a plurality of said rotating devices, a plurality of said advancing and retracting devices, a plurality of said vacuum-supply control devices, and a plurality of said suction-nozzle selecting devices.

8. An apparatus according to claim 2, wherein said first supplying section of said electricity supplying device comprises a first electrically conductive coil provided on said frame member, and said second supplying section of said electricity supplying device comprises a second electrically conductive coil provided on said rotary member as said movable member, said first and second coils cooperating to each other to provide a potential transformer having no wire connection between the first and second coils.

9. An apparatus according to claim 2, wherein said first transmitting section of said information transmitting device comprises a first communication coil provided on said frame member, and said second transmitting section of said information transmitting device comprises a second communication coil provided on said rotary member as said movable member, said first and second coils cooperating with each other to provide a wireless communication device having no wire connection between the first and second coils.

10. An apparatus according to claim 2, further comprising:

a support member which supports said mounting head; and a cam follower fixed to said support member, wherein said frame member comprises a cylindrical cam around which said rotary member as said movable member is provided, said cam follower being engaged with said cylindrical cam so that when said rotary member is rotated, said cam follower and said mounting head are moved up and down.

11. An apparatus according to claim 1, wherein at least one of said main and actuator control devices comprises a computer.

* * * * *